(12) United States Patent
Cantoro et al.

(10) Patent No.: US 9,318,491 B2
(45) Date of Patent: Apr. 19, 2016

(54) SEMICONDUCTOR FIN DEVICES AND METHOD OF FABRICATING THE SEMICONDUCTOR FIN DEVICES

(71) Applicants: Mirco Cantoro, Suwon-si (KR); Taeyong Kwon, Suwon-si (KR); Sangsu Kim, Yongin-si (KR); Jae-Hwan Lee, Seoul (KR)

(72) Inventors: Mirco Cantoro, Suwon-si (KR); Taeyong Kwon, Suwon-si (KR); Sangsu Kim, Yongin-si (KR); Jae-Hwan Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/547,190

(22) Filed: Nov. 19, 2014

(65) Prior Publication Data

US 2015/0249087 A1 Sep. 3, 2015

(30) Foreign Application Priority Data

Feb. 28, 2014 (KR) .................. 10-2014-0024075

(51) Int. Cl.
| | | |
|---|---|---|
| *H01L 27/01* | (2006.01) | |
| *H01L 27/12* | (2006.01) | |
| *H01L 31/0392* | (2006.01) | |
| *H01L 27/092* | (2006.01) | |

(Continued)

(52) U.S. Cl.
CPC ........ *H01L 27/0924* (2013.01); *H01L 27/0886* (2013.01); *H01L 29/16* (2013.01); *H01L 29/20* (2013.01); *H01L 29/36* (2013.01)

(58) Field of Classification Search
CPC . H01L 21/845; H01L 21/8238; H01L 21/762; H01L 21/28079; H01L 21/02178; H01L 21/02172; H01L 21/76205; H01L 21/28556; H01L 21/28158; H01L 21/048; H01L 21/3212; H01L 21/2022; H01L 21/467; H01L 21/475; H01L 21/76264; H01L 21/28194; H01L 27/0924; H01L 27/1104; H01L 27/0922; H01L 27/3248; H01L 29/435
USPC .............. 257/288, 350, 396, 722, 19, 78, 86, 257/192, 200, 201, 507, 701, 760, E21.006, 257/E21.014, E21.023, E21.045, E21.051, 257/E21.092, E21.115, E21.17, E21.126, 257/E21.127, E21.267, E21.286, E21.289, 257/E21.304, E21.32, E21.421, E21.435, 257/E21.573, E21.577, E21.585, E21.632
See application file for complete search history.

(56) References Cited

U.S. PATENT DOCUMENTS

| 7,282,450 B2 | 10/2007 | Shue et al. |
|---|---|---|
| 7,344,942 B2 * | 3/2008 | Korber .............. H01L 21/76229 257/E21.548 |

(Continued)

OTHER PUBLICATIONS

R. Loo et al, Selective Area Growth of InP on On-Axis Si(001) Substrates with Low Antiphase Boundary Formation, Journal of The Electrochemical Society, 159 (3) (2012), pp. 260-265.

(Continued)

*Primary Examiner* — David Nhu
(74) *Attorney, Agent, or Firm* — Volentine & Whitt, PLLC

(57) ABSTRACT

A semiconductor device includes a substrate, an insulating layer disposed on the substrate and having a trench exposing a surface portion of the substrate, and a channel-forming structure comprising crystalline semiconductor material. The channel-forming structure has a lower portion located in the trench and fins extending upright on the lower portion, where the fins are spaced from each other and are each narrower than an opening of the trench, and the lower portion of the channel forming structure has a higher crystal defect density than the fins of the channel forming structure.

20 Claims, 23 Drawing Sheets

(51) Int. Cl.
*H01L 27/088* (2006.01)
*H01L 29/36* (2006.01)
*H01L 29/16* (2006.01)
*H01L 29/20* (2006.01)

(56) References Cited

U.S. PATENT DOCUMENTS

| | | | |
|---|---|---|---|
| 7,799,592 | B2 | 9/2010 | Lochtefeld |
| 7,977,706 | B2 | 7/2011 | Lochtefeld |
| 8,034,697 | B2 | 10/2011 | Fiorenza et al. |
| 8,173,551 | B2 * | 5/2012 | Bai et al. .................... 438/758 |
| 8,183,667 | B2 | 5/2012 | Park |
| 8,253,211 | B2 | 8/2012 | Cheng et al. |
| 8,274,097 | B2 | 9/2012 | Cheng |
| 8,304,805 | B2 | 11/2012 | Lochtefeld |
| 8,309,986 | B2 * | 11/2012 | Lochtefeld ........ H01L 29/66795 257/190 |
| 8,384,196 | B2 | 2/2013 | Cheng et al. |
| 2008/0001169 | A1 | 1/2008 | Lochtefeld |
| 2010/0078680 | A1 | 4/2010 | Cheng et al. |
| 2012/0028444 | A1 | 2/2012 | Vellianitis |
| 2012/0168823 | A1 | 7/2012 | Luo et al. |
| 2012/0175675 | A1 | 7/2012 | Luo et al. |
| 2013/0115721 | A1 | 5/2013 | Clark |

OTHER PUBLICATIONS

N. D. Nguyena et al, Selective epitaxial growth of III-V semiconductor heterostructures on Si substrates for logic applications, ECS Transactions, 33 (6) 933-939 (2010), pp. 933-939.

G. Wang et al, Growth ofhighqualityInPlayersinSTItrenchesonmiscut Si (001)substrates, Journal ofCrystalGrowth315 (2011), pp. 32-36.

M. Cantoroa et al, Heteroepitaxy of III-V Compound Semiconductors on Silicon for Logic Applications: Selective Area Epitaxy in Shallow Trench Isolation Structures vs. Direct Epitaxy mediated by Strain Relaxed Buffers, pp. 1-7.

G. Wang et al, Selective area growth of high quality InP on Si ,, 001 . . . substrates, Applied Physics Letters 97, 121913 (2010), pp. 1-3.

* cited by examiner

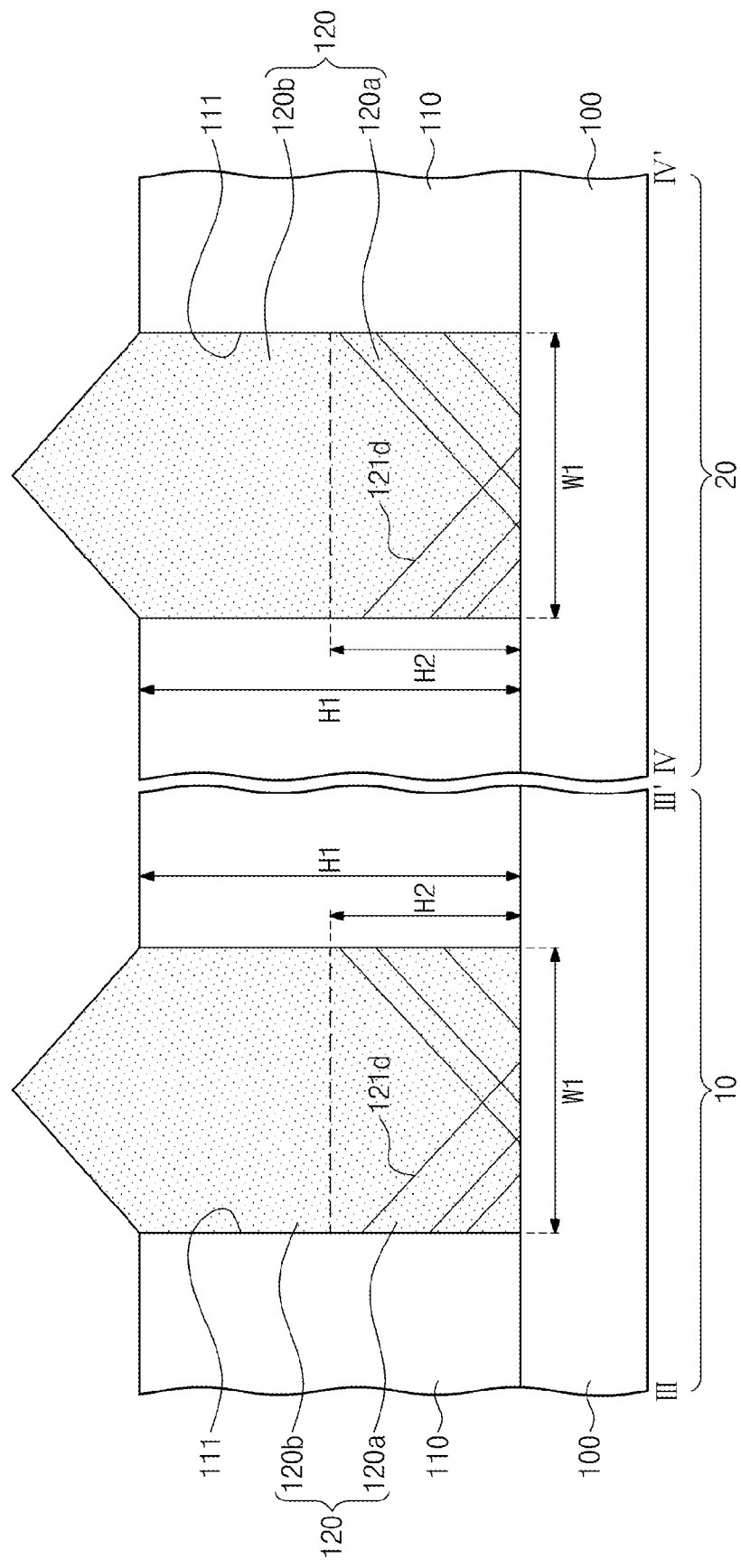

SEMICONDUCTOR FIN DEVICES AND METHOD OF FABRICATING THE SEMICONDUCTOR FIN DEVICES

CROSS-REFERENCE TO RELATED APPLICATION

A claim of priority under 35 U.S.C. §119 is made to Korean Patent Application No. 10-2014-0024075, filed on Feb. 28, 2014, in the Korean Intellectual Property Office, the entire disclosure of which is hereby incorporated by reference.

BACKGROUND

The inventive concepts generally relate to semiconductor devices and to methods of fabricating the semiconductor devices. More particularly, the inventive concepts relate to fin field effect transistors and to methods of fabricating fin field effect transistors.

A semiconductor device may include an integrated circuit (IC) made up of a plurality of Metal Oxide Semiconductor Field Effect Transistors (MOSFETs or MOS transistors for short). Reducing the size and design rule of such a semiconductor device, i.e., increasing the degree of integration of the device, may thus require a scaling-down of MOS transistors. However, such scaling-down of MOS transistors may compromise certain operational characteristics of the semiconductor device. Accordingly, research is being conducted on various techniques aimed at fabricating highly integrated semiconductor devices that offer high performance. In particular, research is being conducted on ways to increase the mobility of charge carriers (electrons or holes) in MOS transistors with the aim of developing high-performance semiconductor devices.

SUMMARY

According to example embodiments of the inventive concepts, a semiconductor device is provided which includes a substrate, an insulating layer disposed on the substrate and having a trench exposing a surface portion of the substrate, and a channel-forming structure comprising crystalline semiconductor material. The channel-forming structure has a lower portion located in the trench and fins extending upright on the lower portion, where the fins are spaced from each other and are each narrower than an opening of the trench, and the lower portion of the channel forming structure has a higher crystal defect density than the fins of the channel forming structure.

The fins may be devoid of crystal defects.

The fins may extend along a length of the trench, may be spaced from each other in a widthwise direction of the trench, and may each be narrower than the trench in the widthwise direction.

The fins may extend upward beyond the opening of the trench.

The crystal defect density in the lower portion of the channel forming structure may increase in a depth direction of the trench.

The fins may include respective buffer patterns which are a unitary part of the lower portion of the channel-forming structure, and fin-shaped channel patterns on the respective buffer patterns, and the buffer patterns and the fin-shaped channel patterns may have different energy band gaps.

The fin-shaped channel patterns may comprise a material selected from the group consisting of Ge, SiGe, and a Group III-V semiconductor compound.

The buffer patterns and the fin-shaped channel patterns may be formed of Group III-V semiconductor compounds having respectively different energy band gaps.

The channel-forming structure may be a unitary body of semiconductor material, and the semiconductor material may be selected from the group consisting of Ge, SiGe, and a Group III-V semiconductor compound.

A depth-to-width aspect ratio of the trench may between 1:1 and 3:1 both inclusive, and the width of the trench may be at least 50 nm.

The semiconductor device may further include a gate electrode extending longitudinally across the fins in the widthwise direction of the trench, a gate insulating layer interposed between the gate electrode and the fins, and source/drain regions in the trench at opposite ends of the fins.

According to other example embodiments of the inventive concepts, a semiconductor device is provided which includes a semiconductor substrate, an insulating layer disposed on the substrate and having a trench exposing a surface portion of the substrate, wherein a depth-to-width aspect ratio of the trench is between 1:1 and 3:1 both inclusive, and a crystalline channel-forming structure disposed in the trench. The crystalline channel-forming structure has an epitaxial lower portion disposed on the surface portion of the semiconductor substrate and occupying a bottom portion of the trench, and epitaxial fins extending upright on the lower portion, and the fins are spaced from each other in a widthwise direction of the trench and are each narrower than the trench in the widthwise direction.

The width of the trench may be at least 50 nm.

The epitaxial fins may include respective buffer patterns which are a unitary part of the epitaxial lower portion of the crystalline channel-forming structure, and fin-shaped epitaxial channel patterns on the respective buffer patterns, and the buffer patterns and the fin-shaped channel patterns may have different energy band gaps.

The buffer pattern and the fin-shaped channel patterns may be formed of Group III-V semiconductor compounds having respectively different energy band gaps.

The semiconductor device may further include a gate electrode extending longitudinally across the epitaxial fins in the widthwise direction of the trench, a gate insulating layer interposed between the gate electrode and the epitaxial fins, and source/drain regions in the trench at opposite ends of the epitaxial fins.

According to still other example embodiments of the inventive concepts, a semiconductor device is provided which includes a substrate, an insulating layer disposed on the substrate and having a first trench exposing a first surface portion of the substrate and a second trench exposing a second surface portion of the substrate, and first and second channel-forming structure comprising crystalline semiconductor material. The first channel-forming structure has a first lower portion located in the first trench and first fins extending upright on the first lower portion, where the first fins are of a first conductivity type, are spaced from each other and are each narrower than an opening of the first trench, and where the first lower portion of the first channel forming structure has a higher crystal defect density than the first fins of the first channel forming structure. The second channel-forming structure has a second lower portion located in the second trench and second fins extending upright on the second lower portion, where the second fins are of a second conductivity type, are spaced from each other and are each narrower than an opening of the second trench, and where the second lower portion of the second channel forming structure has a higher crystal defect density than the second fins of the second channel forming structure.

The semiconductor device may further include a first gate electrode extending longitudinally across the first fins in a widthwise direction of the first trench, a first gate insulating layer interposed between the first gate electrode and the first fins, and first source/drain regions in the first trench at opposite ends of the first fins, wherein the first fins, the first gate electrode, the first gate insulating layer, and the first source/drain regions constitute a PMOS transistor. The semiconductor device may still further include a second gate electrode extending longitudinally across the second fins in a widthwise direction of the second trench, a second gate insulating layer interposed between the second gate electrode and the second fins, and second source/drain regions in the second trench at opposite ends of the second fins, wherein the second fins, the second gate electrode, the second gate insulating layer, and the second source/drain regions constitute a NMOS transistor. The PMOS transistor and the NMOS transistor may be connected in a CMOS configuration.

According to yet other example embodiments of the inventive concept, a method of fabricating a semiconductor device is provided which includes providing an insulating layer on a semiconductor substrate and forming a trench in the insulating layer that exposes a surface portion of the substrate, forming an epitaxial buffer layer in the trench using the surface portion of the substrate as a seed, and forming epitaxial fins of semiconductor material at an upper surface of the epitaxial buffer layer, the epitaxial fins being spaced from each other and each being narrower than an opening of the trench.

The epitaxial fins may be formed by patterning an upper surface of the epitaxial buffer layer.

The method may further include, before forming the epitaxial fins, patterning the epitaxial buffer layer to form plural epitaxial buffer patterns at the upper surface of the epitaxial buffer layer, where the epitaxial fins are grown at the respective upper surfaces of the epitaxial buffer patterns using the epitaxial buffer patterns as a seed.

An energy band gap of the epitaxial fins may differ from an energy band gap of the epitaxial buffer patterns.

The epitaxial buffer patterns and the epitaxial fins may be each formed of one of Ge, SiGe and Group III-V semiconductor compounds having respectively different energy band gaps.

Bottoms of the epitaxial fins may be situated in the trench, and tops of the epitaxial fins may extend above the trench.

Selective epitaxial growth (SEG) processes may be utilized to form the epitaxial buffer layer and the epitaxial fins. The SEG processes may each be selected from the group consisting of solid phase epitaxy (SPE), vapor phase epitaxy (VPE), liquid phase epitaxy (LPE), molecular beam epitaxy (MBE), chemical vapor deposition (CVD), reduced pressure CVD (RPCVD) and ultra high vacuum CVD (UHCVD).

A depth-to-width aspect ratio of the trench may be between 1:1 and 3:1 both inclusive, and a width of the trench may be at least 50 nm.

The method may further include forming a gate insulating layer and a gate electrode conformally over the epitaxial fins across a width of the trench, and source/drain regions in the trench at opposite ends of the epitaxial fins.

BRIEF DESCRIPTION OF THE DRAWINGS

The inventive concepts will become readily understood from the detailed description that follows, with reference to the accompanying drawings.

FIGS. 8A, 8B, 8C, 8D, 8E, 8F and 8G are sectional views taken in the direction of lines III-III' and IV-IV' of FIG. 7, and collectively illustrate another embodiment of a method of fabricating a semiconductor device according to the inventive concept.

DETAILED DESCRIPTION OF THE PREFERRED EMBODIMENTS

Figure 1:
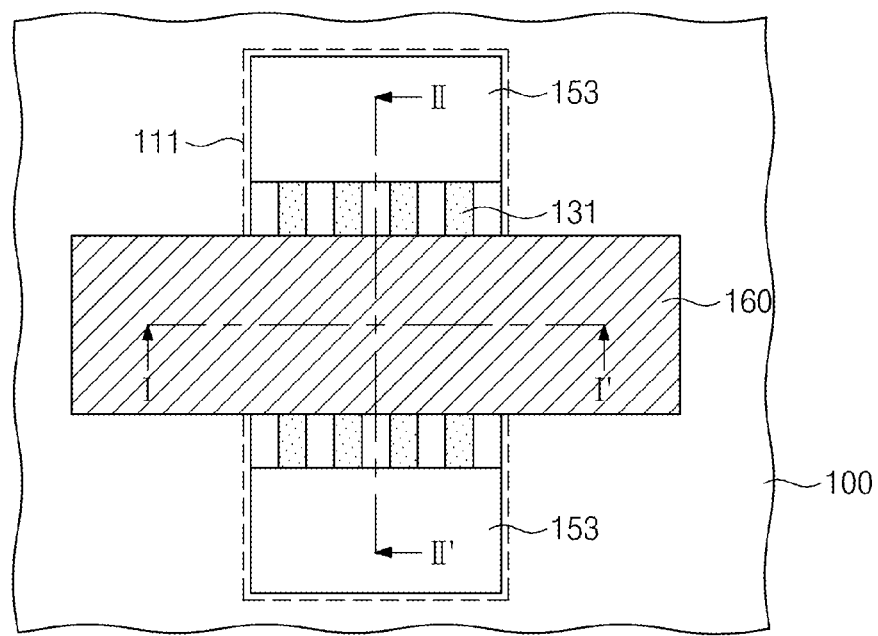
FIG. 1 is a plan view of an embodiment of a semiconductor device according to the inventive concept.

Various embodiments and examples of embodiments of the inventive concept will be described more fully hereinafter with reference to the accompanying drawings. In the drawings, the sizes and relative sizes and shapes of elements, layers and regions shown in section may be exaggerated for clarity. In particular, the cross-sectional illustrations of the semiconductor devices and intermediate structures fabricated during the course of their manufacture are generally schematic. Also, like numerals are used to designate like elements throughout the drawings.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present.

It will be understood that although the terms first, second, third etc. are used herein to describe various elements, regions, layers, etc., these elements, regions, and/or layers are not limited by these terms. These terms are only used to distinguish one element, layer or region from another.

Furthermore, spatially relative terms, such as "upper" and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use. In addition, the terms "upper" or "top" and "lower" or "bottom" as used to describe a surface generally refer not only to the orientation depicted in the drawings but to the fact that the surface is the uppermost or bottommost surface in the orientation depicted, as would be clear from the drawings and context of the written description.

Other terminology used herein for the purpose of describing particular examples or embodiments of the inventive concept is to be taken in context. For example, the terms "comprises" or "comprising" when used in this disclosure specifies the presence of stated features or processes but does not preclude the presence or additional features or processes. Furthermore, the term "width" will refer to the shorter dimension of a feature such as a trench elongated in a horizontal X-Y plane, i.e., the term "width" will refer to the dimension in the X-Y plane perpendicular to the direction in which the trench extends longitudinally in the X-Y plane. Also, the terms "height" and "thickness" will be generally understood as referring to the vertical dimension of a layer or feature, i.e., a dimension along a Z-axis perpendicular to the X-Y plane. Finally, the terms "substantially free of crystal defects" and "devoid of crystal defects" as used to describe a particular material/region will be understood to mean completely free of crystal defects or such a low density of crystal defects that no affect of any crystal defects on the function that material/region is observed.

An embodiment of a semiconductor device according to the inventive concept, and a method of fabricating the semiconductor device, will now be described in detail with reference to FIG. 1, FIGS. 2A through 2G, and FIG. 3.

Figure 2A:
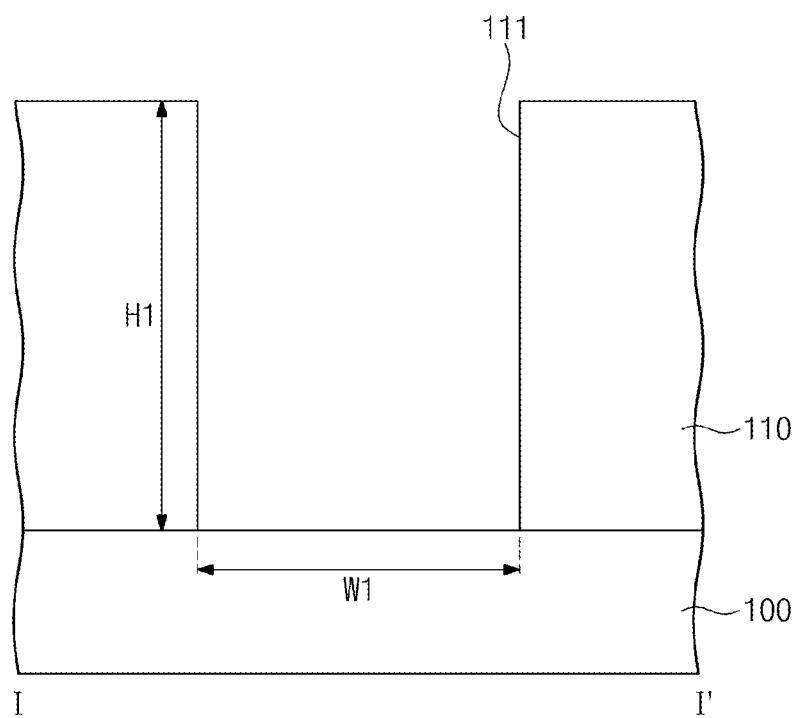
FIGS. 2A, 2B, 2C, 2D, 2E, 2F and 2G are sectional views taken in the direction of line I-I' of FIG. 1 and collectively illustrate a method of fabricating a semiconductor device according to the inventive concept.

Referring first to FIGS. 1 and 2A, an insulating layer 110 is formed on a semiconductor substrate 100, and a first trench 111 is formed in the insulating layer 110 to expose a portion of the semiconductor substrate 100.

The semiconductor substrate 100 may be a single crystalline silicon wafer. Alternatively, the semiconductor substrate 100 may be a silicon-on-insulator (SOI) wafer, a germanium wafer, a germanium-on-insulator (GOI) wafer, a silicon-germanium wafer, or a substrate including an epitaxial layer. Still further, the semiconductor substrate 100 may instead be of at least one Group III-V semiconductor compound.

The insulating layer 110 may be formed of at least one material selected from the group consisting of $O_3$-Tetra Ethyl Ortho Silicate ($O_3$-TEOS), Undoped Silicate Glass (USG), PhosphoSilicate Glass (PSG), Borosilicate Glass (BSG), BoroPhosphoSilicate Glass (BPSG), High Density Plasma (HDP) oxide, Undoped Silicate Glass (USG), Fluoride Silicate Glass (FSG), Spin On Glass (SOG) material, and Tonen SilaZene (TOSZ). Also, the insulating layer 110 may be formed using a Chemical Vapor Deposition (CVD) or spin coating process. The thickness to which the insulating layer 110 is formed will generally depend on the height to which a buffer layer 120 is to be formed in a subsequent process (FIG. 2B).

The first trench 111 can be formed by forming a mask (not shown) on the insulating layer 110 and anisotropically etching the insulating layer 110 using the mask (not shown) as an etch mask.

In the illustrated embodiment, the first trench 111 has a height (or depth) H1, which is substantially the same as the thickness of the insulating layer 110, and a width W1, which may be about the same or less than the height H1. For example, the width W1 of the first trench 111 may range from about 50 nm to about 500 nm and the first trench 111 may have an aspect ratio (H1/W1) ranging from about 1 to about 3 both inclusive.

Figure 2B:
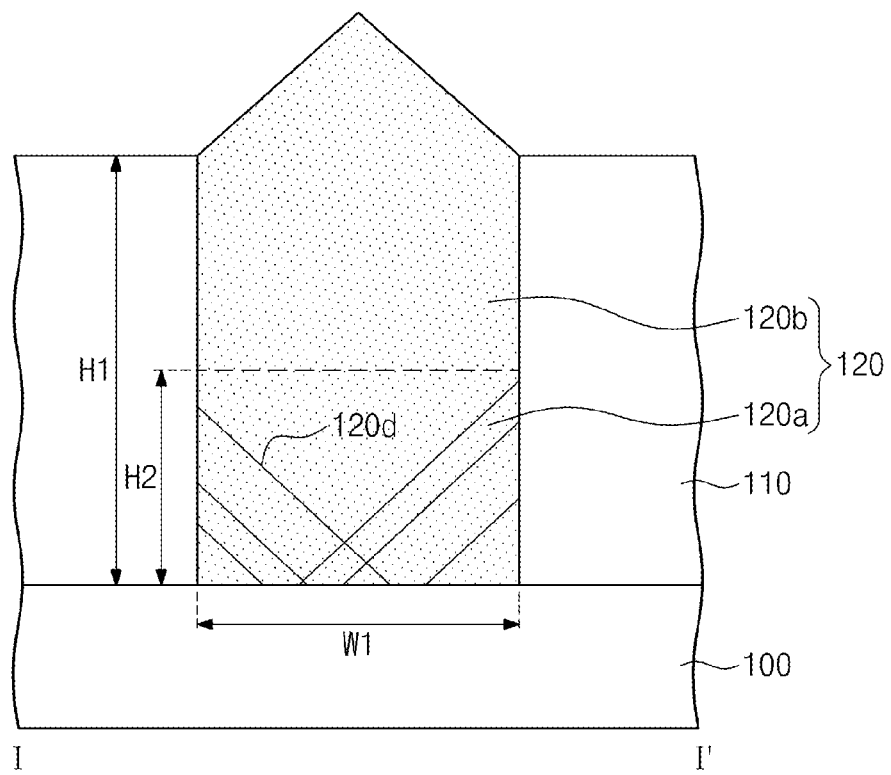

Referring to FIGS. 1 and 2B, a buffer layer 120 is formed to fill the first trench 111.

The buffer layer 120 is formed of a semiconductor material, whose lattice constant is different from that of the semiconductor substrate 100. For example, the buffer layer 120 may be of at least one material selected from the group consisting of Si, Ge, SiGe, and Group III-V semiconductor compounds. Examples of Group III-V semiconductor compounds include aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), and indium antimonide (InSb).

In one example of this embodiment, the buffer layer 120 is formed by a selective epitaxial growth (SEG) process using the semiconductor substrate 100 as a seed layer. In this case, the selective epitaxial growth process may be solid phase epitaxy (SPE), vapor phase epitaxy (VPE), or liquid phase epitaxy (LPE). Other examples of processes for forming the buffer layer 120 include molecular beam epitaxy (MBE), chemical vapor deposition (CVD), reduced pressure CVD (RPCVD) and/or ultra high vacuum CVD (UHCVD).

In any case, a lower portion 120a of the buffer layer 120 may have crystal defects whereas the upper portion 120b is substantially free of crystal defects. Examples of the various crystal defects which may be produced in the lower portion 120a of the buffer layer 120 include threading dislocations, stacking faults, twin boundaries, and anti-phase boundaries. Such crystal defects can be produced due to differences in the rates at which the crystals grow in different crystal planes under the selective epitaxial growth (SEG) process, for example.

An example will now be described in which threading dislocations 120d are produced in the buffer layer 120 in the case in which the buffer layer 120 is formed using an SEG process. The threading dislocations 120d tend to propagate or extend from the top surface of the semiconductor substrate toward a sidewall surface of the insulating layer 110 during the SEG process, but such propagation or extension of the threading dislocations 120d can be blocked by the sidewall surface of the insulating layer 110. Also, the threading dislocations 120d may be formed at an angle of about 30-60 degrees relative to the top surface of the semiconductor substrate 100. Accordingly, most of the threading dislocations 120d formed during the SEG process may be trapped or localized in a region of the buffer layer 120, i.e., in the aforementioned lower portion 120a, confined below a specific height H2 from the top surface of the semiconductor substrate 100. As a result, the density of the threading dislocations 120d decreases in a vertical direction away from the semiconductor substrate 100.

As mentioned above, the first trench 111 may be formed such that the height H1 thereof is one to three times the width W1 of the first trench 111. This is to more effectively trap or localize the crystal defects in the lower portion 120a of the first buffer layer 120. In this case, the height H2 of the region (i.e., the lower portion 120a of the buffer layer 120), in which most of the crystal defects are trapped, is dictated by the angle at which the threading dislocations 120d propagate or extend from the top surface of the semiconductor substrate 100 and the width W1 of the first trench 111.

In the illustrated embodiment, the buffer layer 120 is formed to fill the first trench 111. Furthermore, the buffer layer 120 may be formed by an SEG process in an overgrowth manner such that the top surface of the buffer layer 120 extends higher than does that of the insulating layer 110. Also, as is shown in FIG. 2B, the top surface of the buffer layer 120 may have facets, each of which is disposed at an acute angle relative to the top surface of the semiconductor substrate 100. The facets are naturally produced by the SEG process due to differences in the growth rates of crystals, in different crystal planes.

The buffer layer 120 may then be planarized to remove that portion of the buffer layer 120 protruding from the top surface of the insulating layer 110. In this respect, the buffer layer 120 may be planarized using an etch-back process and/or a chemical mechanical polishing (CMP) process.

In any case, if the first trench 111 were too narrow and the buffer layer 120 were formed by an SEG process, the buffer layer 120 would have crystal defects throughout due to non-uniform growth of the crystals during the SEG process. In other words, as the semiconductor device is scaled-down, i.e., as the buffer layer 120 becomes more narrow, it becomes more and more difficult to provide the buffer layer 120 with a good crystalline property. On the other hand, as will be clear from the description that follows, according to the inventive concept, a plurality of fine patterns (e.g., fin-shaped channel patterns 131) whose widths are smaller than the width W1 of the first trench 111 are formed from crystalline semiconductor material that is substantially free of crystal defects.

Figure 2C:
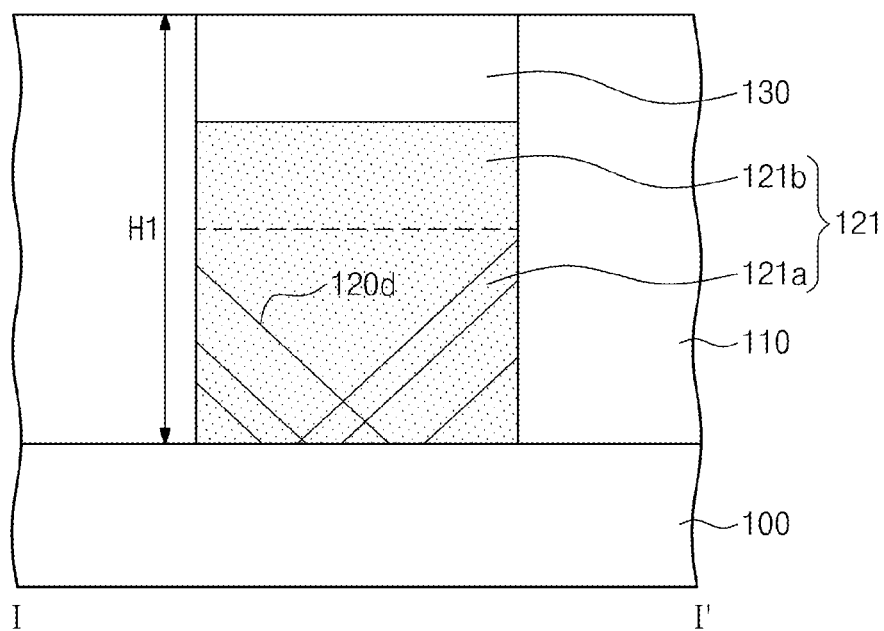

Next, and referring to FIGS. 1 and 2C, in this embodiment, the buffer layer 120 is recessed to form a buffer pattern 121 exposing an upper portion of the sidewall surface of the first trench 111. The recessing of the buffer layer 120 can be carried out by anisotropically etching the planarized buffer layer 120 using etchant having an etch selectivity with respect to the insulating layer 110. As a result, the height (or thickness) of the buffer pattern 121 is smaller than the thickness H1 of the insulating layer 110.

Furthermore, the recessing of the buffer layer 120 is controlled such that the top surface of the buffer pattern 121 does not include any of the crystal defects that were present in the lower portion 120a of the buffer layer. That is, the recessing of the buffer layer 120 is controlled such that a lower portion 121a of the buffer pattern 121 has crystal defects whereas an upper portion 121b of the buffer pattern 121 is substantially free of crystal defects.

Next, a channel layer 130 is formed on the buffer pattern 121 to fill the upper portion of the first trench 111. The channel layer 130 has a band gap different from, e.g., smaller than, that of the buffer pattern 121. In addition, the buffer pattern 121 may exert a compressive or tensile stress on the channel layer 130 so that the channel layer 130 is a strained channel layer.

To one or more of these ends, the channel layer 130 may be formed of at least one material selected from the group consisting of Si, Ge, SiGe, and Group III-V semiconductor compounds. Examples of Group III-V semiconductor compounds include aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), and indium antimonide (InSb).

In one set of examples of this embodiment, the buffer pattern 121 is formed of SiGe, and the channel layer 130 is formed of Si or Ge.

In another example, the buffer pattern 121 and the channel layer 130 are each formed of SiGe, but the Ge concentration differs among the buffer pattern 121 and the channel layer 130.

In other examples, the buffer pattern 121 and the channel layer 130 are formed of Group III-V semiconductor compounds whose energy band gaps are different from each other. In this case, the compounds may be the same. That is, the channel layer 130 may be formed of the same compound as the buffer pattern 121, but the ratio of the elements constituting the compound of the channel layer 130 differ from the ratio of the elements constituting the compound of the buffer layer pattern 121.

Furthermore, the channel layer 130 may include a quantum well layer and a capping layer. In this case, the quantum well layer may have an energy band gap that is smaller than that of the buffer layer 120. For example, the quantum well layer may include Si, Ge, SiGe, or a Group III-V semiconductor compound, and the capping layer may include Si or SiGe.

In an example of the method of fabricating the semiconductor device according to the inventive concept, the channel layer 130 is formed by a SEG process using the semiconductor substrate 100 as a seed layer. In this case, the selective epitaxial growth process may include solid phase epitaxy (SPE), vapor phase epitaxy (VPE) and/or liquid phase epitaxy (LPE). Alternatively, the channel layer 130 may be formed using at least one of molecular beam epitaxy (MBE), chemical vapor deposition (CVD), reduced pressure CVD (RPCVD), and ultra high vacuum CVD (UHCVD).

If the SEG process is used and performed in an over growth manner, the channel layer 130 protrudes upward beyond the level of the top surface of the insulating layer 110. In this case, a planarization process (for example, a CMP process) may be performed to remove the protruding portion of the channel layer 130.

Figure 2D:
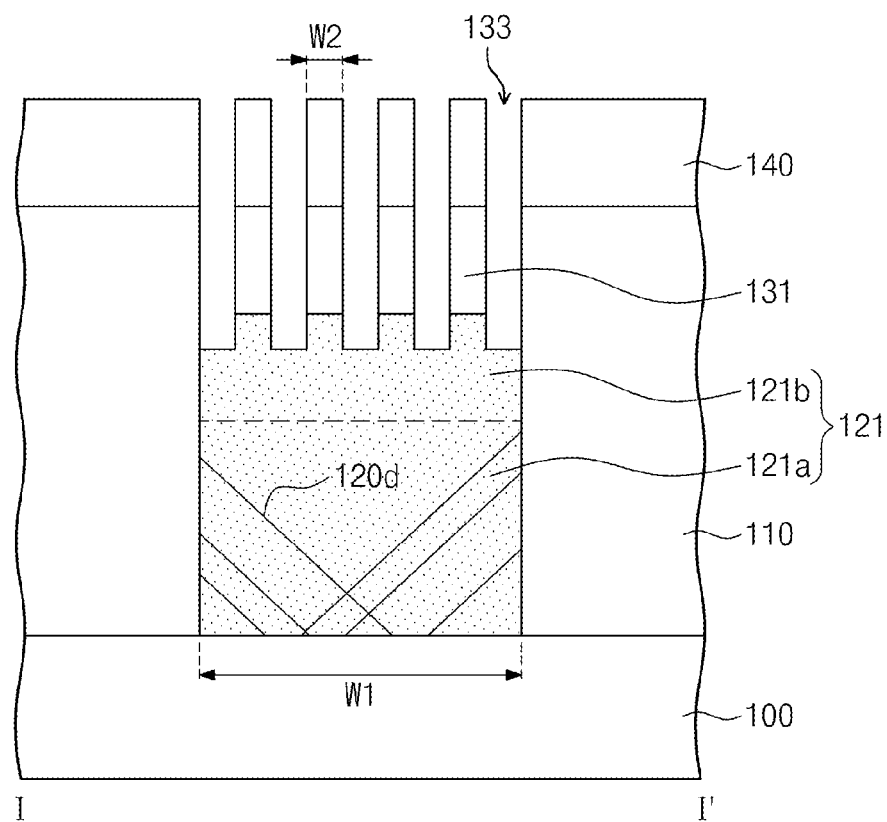

Referring to FIGS. 1 and 2D, the channel layer 130 is patterned to form a plurality of fin-shaped channel patterns 131 on the buffer pattern 121.

The fin-shaped channel patterns 131 can be formed by forming a mask 140 on the insulating layer 110 to expose portions of the channel layer 130, and then, anisotropically etching the channel layer 130 using the mask 140 as an etch mask to form second trenches 133 which delimit the fin-shaped channel patterns 131. Each of the second trenches 133 may be formed to narrower than the first trench 111 (in the widthwise direction perpendicular to the longitudinal direction of the trenches). In the illustrated example, the second trenches 133 also expose part of the sidewall surface of the insulating layer 110. In addition, the buffer pattern 121 may be partially etched, when the second trenches 133 are formed. Accordingly, the buffer pattern 121 may also include a plurality of fin-shaped portions, with the fin-shaped patterns 131 extending upright on the fin-shaped portions of the buffer pattern 121, respectively.

In any case, the width W2 of each of the fin-shaped channel patterns 131 is smaller than the width W1 of the first trench 111 (and buffer pattern 121 at the bottom of the first trench 111). For example, the width W2 of each of the fin-shaped channel patterns 131 may be about ½ to ¹⁄₁₀ times the width W1 of the first trench 121. Thus, in an actual embodiment, the width W2 of each of the fin-shaped channel patterns 131 may range from about 10 nm to about 50 nm. Also, the distance between adjacent ones of the fin-shaped channel patterns 131 may differ from the distance between the sidewall surface of the insulating layer 110 and the fin-shaped channel pattern 131 closest thereto.

Figure 2E:
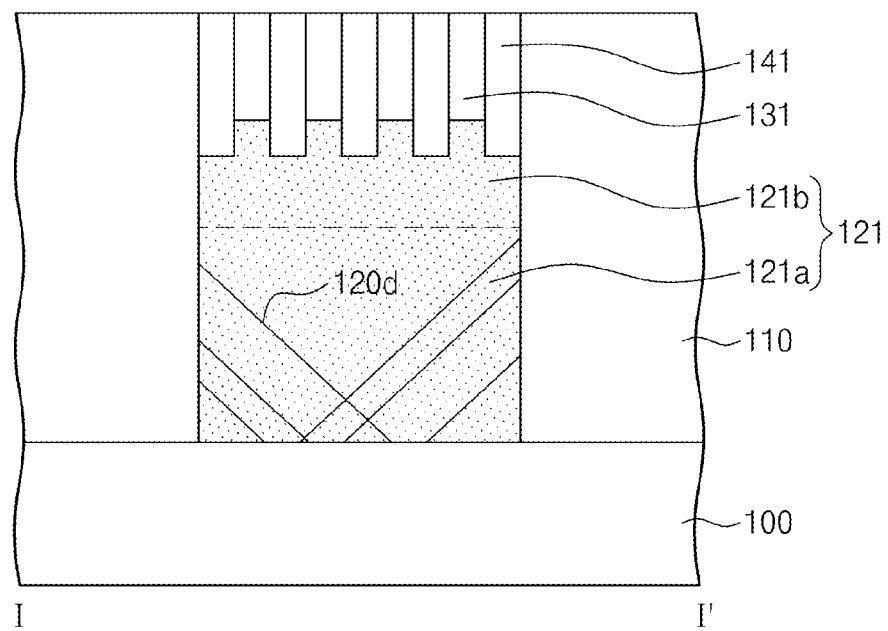

Referring to FIGS. 1 and 2E, an insulating gap-filling layer 141 is formed to fill the second trenches 133.

The insulating gap-filling layer 141 is preferably formed of an insulating material having a good gap-filling property. Furthermore, the insulating gap-filling layer 141 may be formed of the same insulating material as the insulating layer 110. For example, the insulating gap-filling layer 141 may be formed of at least one material selected from the group consisting of O3-Tetra Ethyl Ortho Silicate (O3-TEOS), Undoped Silicate Glass (USG), PhosphoSilicate Glass (PSG), Borosilicate Glass (BSG), BoroPhosphoSilicate Glass (BPSG), High Density Plasma (HDP) oxide, Undoped Silicate Glass (USG), Fluoride Silicate Glass (FSG), Spin On Glass (SOG) material, and Tonen SilaZene (TOSZ). Furthermore, the insulating gap-filling layer 141 may be formed using a deposition process having a good step coverage property. Next, the insulating gap-filling layer 141 may be planarized to expose top surfaces of the fin-shaped channel patterns 131. The planarization of the gap-filling layer 141 may be effected by an etch-back process and/or a CMP process.

Figure 2F:
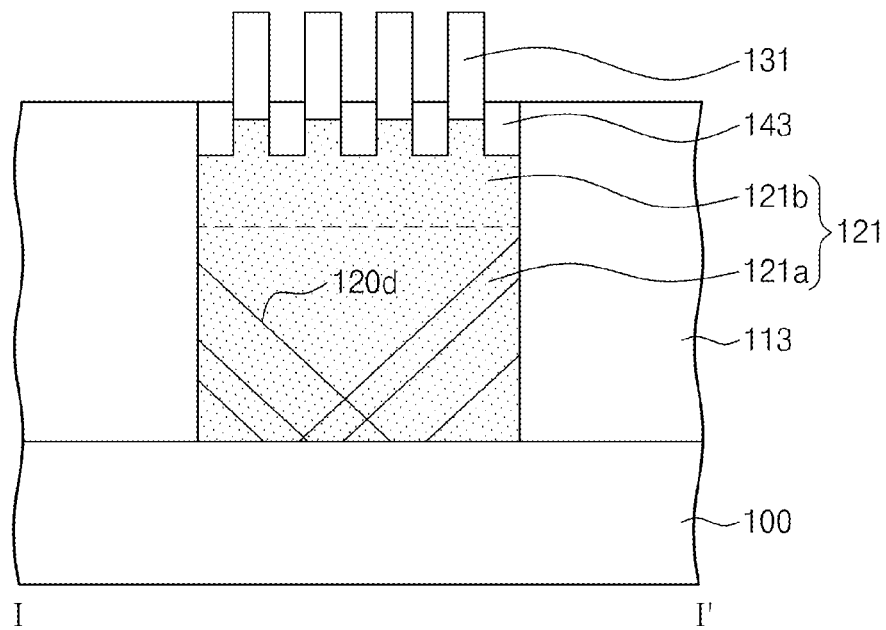

Referring to FIGS. 1 and 2F, the insulating layer 110 and the insulating gap-filling layer 141 are etched to expose sidewall surfaces of the fin-shaped channel patterns 131.

For example, the insulating layer 110 and the insulating gap-filling layer 141 may be selectively etched using etchant having an etch selectivity with respect to the fin-shaped channel patterns 131. Accordingly, a recessed insulating layer 113 is produced around the buffer pattern 121, and an insulating gap-filling pattern 143 is formed between the fin-shaped channel patterns 131. In an example of this embodiment, top surfaces of the recessed insulating layer 113 and the insulating gap-filling pattern 143 are coplanar and located at a level between the respective levels of the tops and bottoms of the fin-shaped channel patterns 131.

Figure 2G:
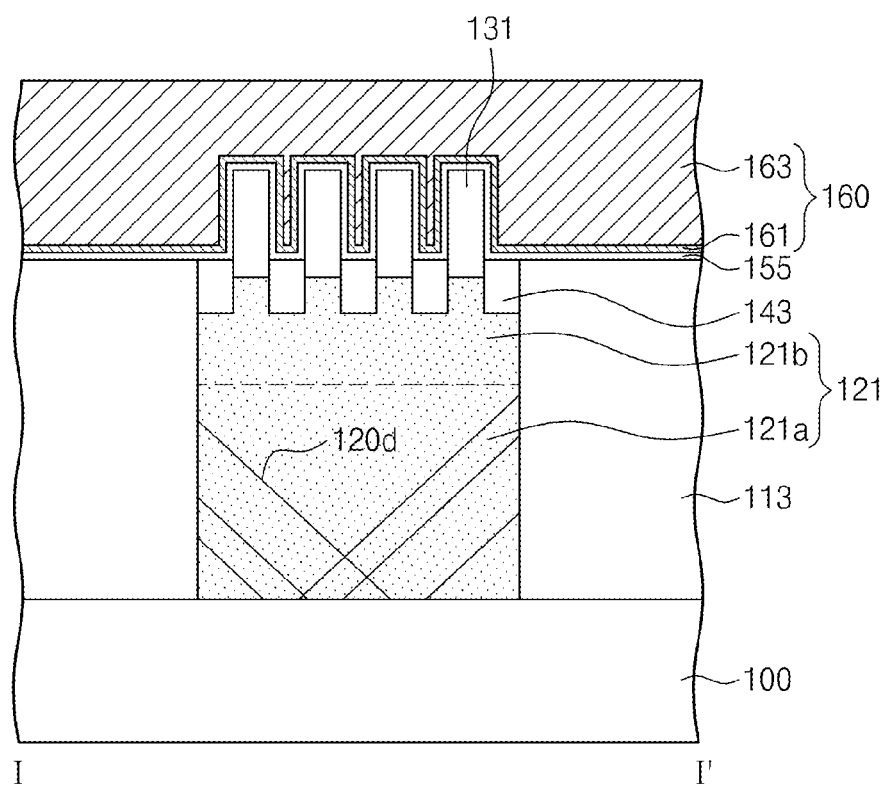
Figure 3:
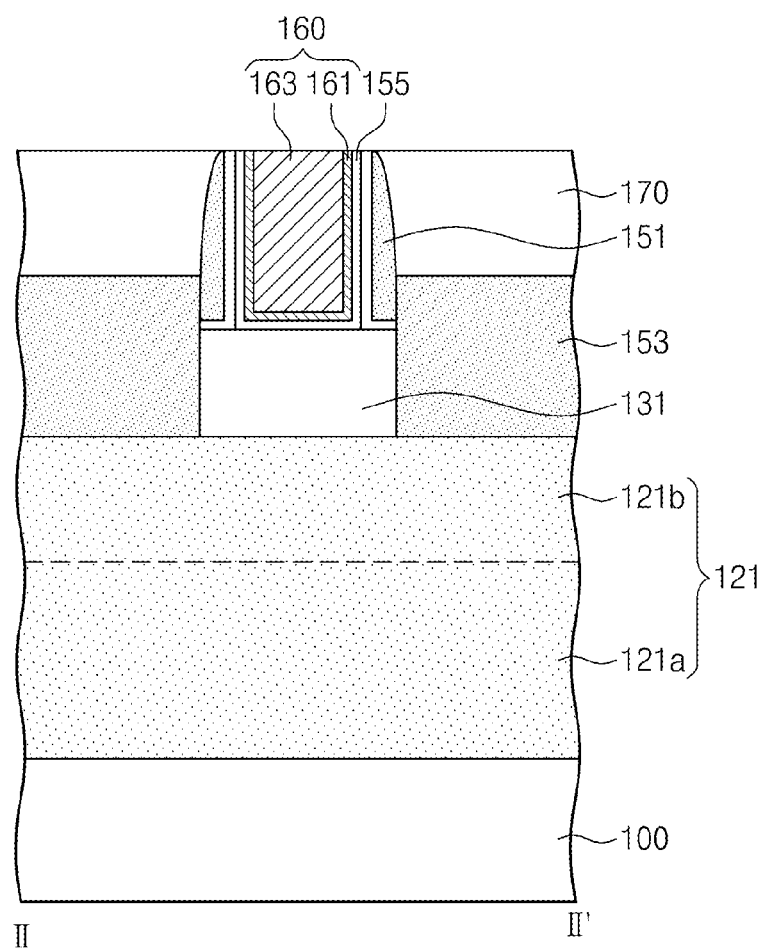
FIG. 3 is a sectional view taken in the direction of line II-IP of FIG. 1.

Referring to FIGS. 1, 2G, and 3, a gate insulating layer 155 may be conformally formed over the surfaces of the fin-shaped channel patterns 131, and a gate electrode 160 may be formed to cross the fin-shaped channel patterns 131.

For example, a dummy gate pattern (not shown) is formed across the fin-shaped channel patterns 131, insulating spacers 151 are formed on both sidewalls of the dummy gate pattern, the dummy gate pattern is removed to form a gate region exposing the fin-shaped channel patterns 131 between the insulating spacers 151, and then, the gate insulating layer 155 and the gate electrode 160 are sequentially formed in the gate region. Furthermore, before the gate electrode 160 has been formed, source and drain electrodes 153 may be formed in portions of the fin-shaped channel patterns 131 located at both sides of the dummy gate pattern.

Alternatively, the gate insulating layer 155 and a gate conductive layer may be sequentially formed to cover the fin-shaped channel patterns 131, and then, the gate insulating layer 155 and the gate conductive layer are patterned to form the gate electrode 160. After the gate electrode 160 has been formed, the source and drain electrodes 153 are formed in portions of the fin-shaped channel patterns 131 located at both sides of the gate electrode 160.

The gate insulating layer 155 may be formed of a high-k dielectric (e.g., hafnium oxide, hafnium silicate, zirconium oxide, or zirconium silicate). The gate insulating layer 155 may be formed using an atomic layer deposition process, and thus, the gate insulating layer 155 may conform to the topography of the side and top surfaces of the fin-shaped channel patterns 131. Alternatively, the gate insulating layer 155 may be formed by thermally oxidizing the exposed surfaces of the fin-shaped channel patterns 131.

The gate electrode 160 may be formed in such a way that the thickness of the portion thereof on the top surface of the insulating layer 110 is greater than the thickness of the portion thereof on the top surfaces of the fin-shaped channel patterns 131. Furthermore, the gate electrode 160 may be formed to fill what remains of the gaps between the fin-shaped channel patterns 131 after the gate insulating layer 155 has been formed. In an example of this embodiment, the gate electrode 160 comprises a barrier metal layer 161 and a metal layer 163 stacked on the barrier metal layer 161. The barrier metal layer 161 may be formed of a conductive material or a metal nitride material. For example, the barrier metal layer 161 may include at least one of titanium nitride, tantalum nitride, tungsten nitride, hafnium nitride, and zirconium nitride. The metal layer 163 may be formed of at least one material having lower resistivity than the barrier metal layer 161. For example, the metal layer 163 may include at least one material selected from the group consisting of tungsten, copper, hafnium, zirconium, titanium, tantalum, aluminum, ruthenium, palladium, platinum, cobalt, nickel, and conductive metal nitrides.

The semiconductor device may comprise an NMOS field effect transistor. In this case, the buffer pattern 121 may exert a tensile stress on the fin-shaped channel patterns 131, i.e., the NMOS may have a tensile-strained channel. To this end, for example, the buffer pattern 121 may be formed of $Si_{1-x}Ge_x$, and the channel layer 130 may be formed of Si. Alternatively, the buffer pattern 121 may be formed of $Si_{1-x}Ge_x$, and the channel layer 130 may be formed of $Si_{1-y}Ge_y$ (where x>y). In still another example of an NMOS having a tensile-strained channel, the buffer pattern 121 may be formed of $In_{1-x}Ga_xAs$, and the channel layer 130 may be formed of $In_{1-y}Ga_yAs$ (wherein x<y).

The semiconductor device may also comprise a PMOS field effect transistor. In this case, the buffer pattern 121 may exert a compressive stress on the fin-shaped channel patterns 131, i.e., the PMOS may have a compressive-strained channel. To this end, for example, the buffer pattern 121 may be formed of $Si_{1-x}Ge_x$, and the channel layer 130 may be formed of Ge. Alternatively, the buffer pattern 121 may be formed of $Si_{1-z}Ge_z$, and the channel layer 130 may be formed of $Si_{1-w}Ge_w$ (wherein z<w). In still another example of a PMOS having a compressive-strained channel, the buffer pattern 121 may be formed of $In_{1-z}Ga_zAs$, and the channel layer 130 may be formed of $In_{1-w}Ga_wAs$ (wherein z>w).

Figure 4:
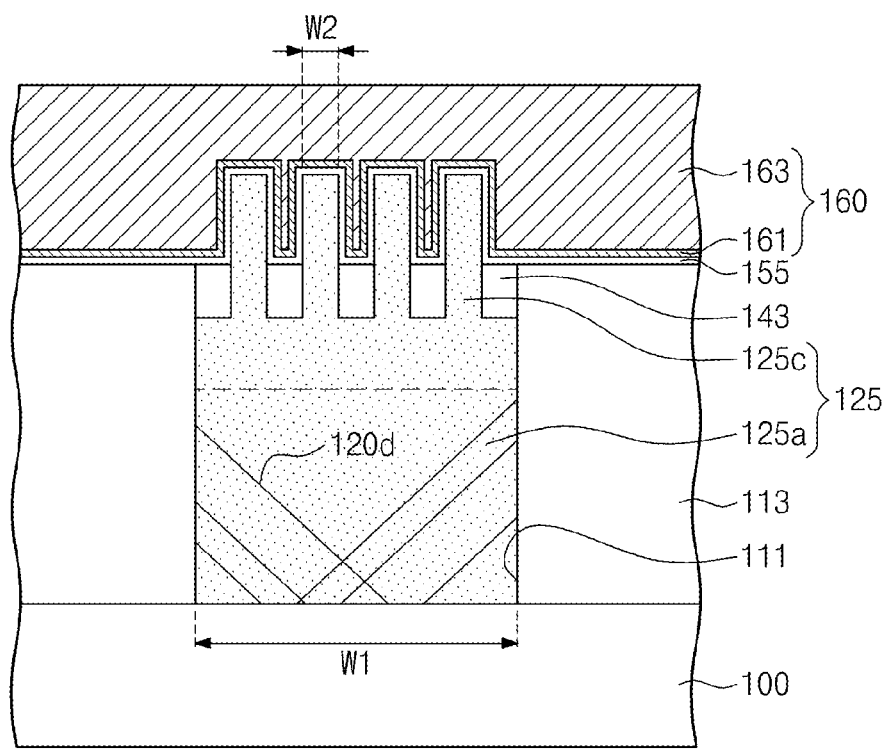
FIGS. 4, 5 and 6 are sectional views of other examples of a semiconductor device according to the inventive concept, respectively.
Figure 5:
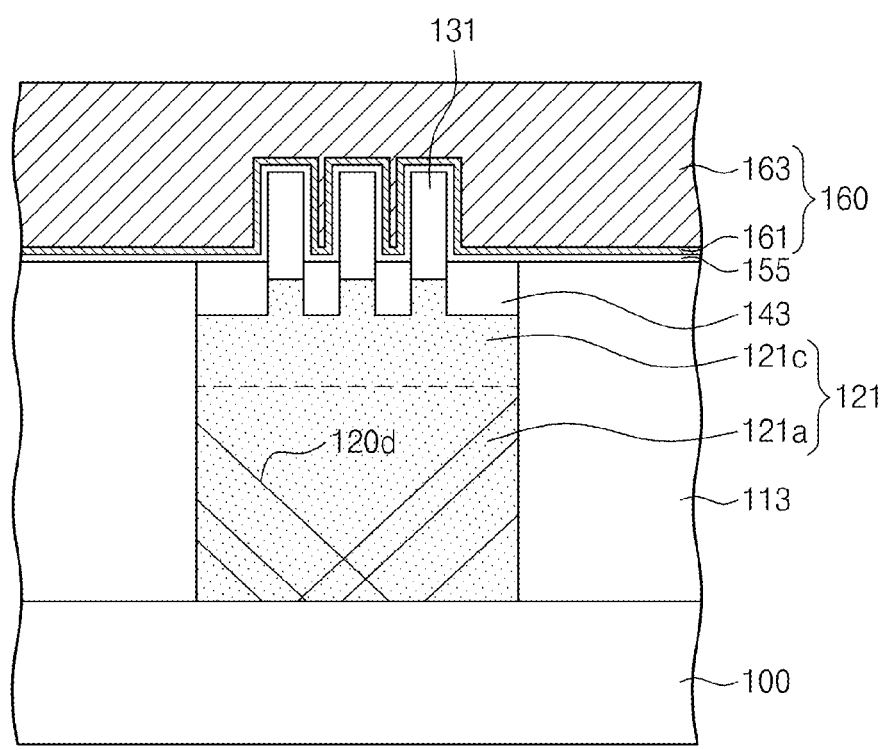
Figure 6:
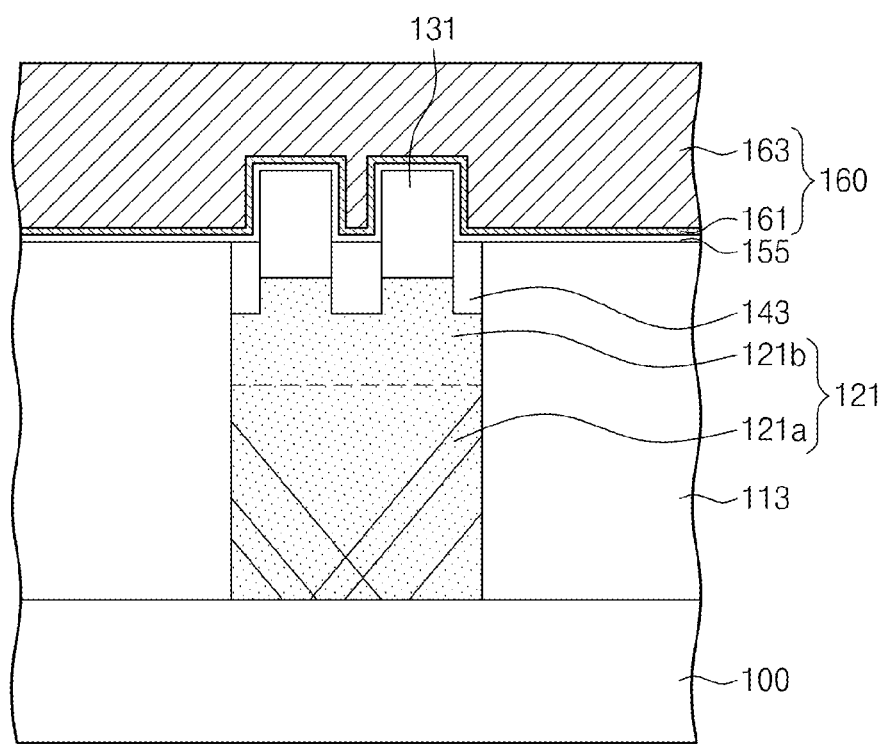

FIGS. 4 through 6 illustrate some other examples of a semiconductor device according to the inventive concept.

In the embodiment of FIGS. 2A-2G and 3, the buffer pattern 121 and the fins formed from the channel layer 230 constitute a channel-forming structure of a transistor.

According to the example shown in FIG. 4, the channel layer 130 may be omitted such that the channel-forming structure of the transistor is constituted by only a buffer pattern.

More specifically, the semiconductor device of this example includes a buffer pattern 125 formed by performing an SEG process to form a buffer layer in the first trench 111, forming a mask on the buffer layer, and etching the buffer layer using the mask as an etch mask to form the second trenches in the buffer layer. Each of the second trenches are narrower than the trench 111 in the insulating layer 110. In addition, before the mask is formed, the epitaxially-grown buffer layer may be planarized until its top surface is coplanar with that of the insulating layer 110, and the second trenches may be formed by anisotropically etching the planarized upper portion of the buffer layer.

Furthermore, in this example, as shown in FIG. 4, the buffer pattern 125 includes a lower portion 125a whose width is the same as the width W1 of the first trench 111, and a plurality of fin-shaped portions 125c extending contiguously to and from the lower portion 125a with each of the fin-shaped portions 125c having a width W2 smaller than the width W1 of the first trench 111. The top surfaces of the fin-shaped portions 125c are disposed at a level higher than those of the insulating gap-filling pattern 143 and the recessed insulating layer 113. Also, as described with reference to FIG. 2B, the lower portion 125a of the buffer pattern 125 has crystal defects, such as the threading dislocations 120d, whereas the fin-shaped portions 125c are of a mono-crystalline semiconductor material which is substantially free of the crystal defects (e.g., threading dislocations 120d).

More specifically, in the example of FIG. 4, the buffer pattern 125 is provided in the first trench 111 such that the lower portion 125a of the buffer pattern 125 has the same first width W1 as that trench 111, and the buffer pattern 125 has a plurality of the fin-shaped portions 125c extending from the lower portion 125a and each of which has a second width W2 smaller than the first width W1. The lower portion 125a may have crystal defects (e.g., threading dislocations 125d), which may be produced during the SEG process, whereas the fin-shaped portions 125c are of substantially defect-free mono-crystalline semiconductor material. That is, in the buffer pattern 125, the density of crystal defects is significantly higher in the lower portion 125a than in the fin-shaped portions 125c. In addition, the insulating gap-filling pattern 143 is interposed between the fin portions 125c of the buffer pattern 125, and the top surface of the insulating gap-filling pattern 143 is disposed at a level below that of the top surfaces of the fin portions 125c.

In addition, in this example, gate electrode 160 extends across the fin-shaped portions 125c of the buffer pattern 125, and gate insulating layer 155 is interposed between the gate electrode 160 and the fin-shape portions 125c.

In the example shown in FIG. 5, a plurality of the fin-shaped channel patterns 131 are provided on the buffer pattern 121, and the distance between adjacent ones of the fin-shaped channel patterns 131 differs from the width of the insulating gap-filling pattern 143 interposed between a sidewall surface of the insulating layer 110 and the fin-shaped channel pattern 131 closest to the sidewall surface. In particular, in this example, the distance between adjacent ones of the fin-shaped channel patterns 131 is smaller than the width of the insulating gap-filling pattern 143 interposed between a sidewall surface of the insulating layer 110 and the fin-shaped channel pattern 131 closest to the sidewall surface.

According to still another example shown in FIG. 6, two or more fin-shaped channel patterns 131 are provided on the buffer pattern 121. However, in this example, the width of the insulating gap-filling pattern 143 interposed between a sidewall surface of the insulating layer 110 and the fin-shaped channel pattern 131 closest to the sidewall surface is smaller than the distance between adjacent ones of the fin-shaped channel patterns 131.

Another embodiment of a semiconductor device and a method of fabricating the same, according to the inventive concept, will now be described in detail with reference to FIG. 7 and FIGS. 8A through 8G.

Figure 7:
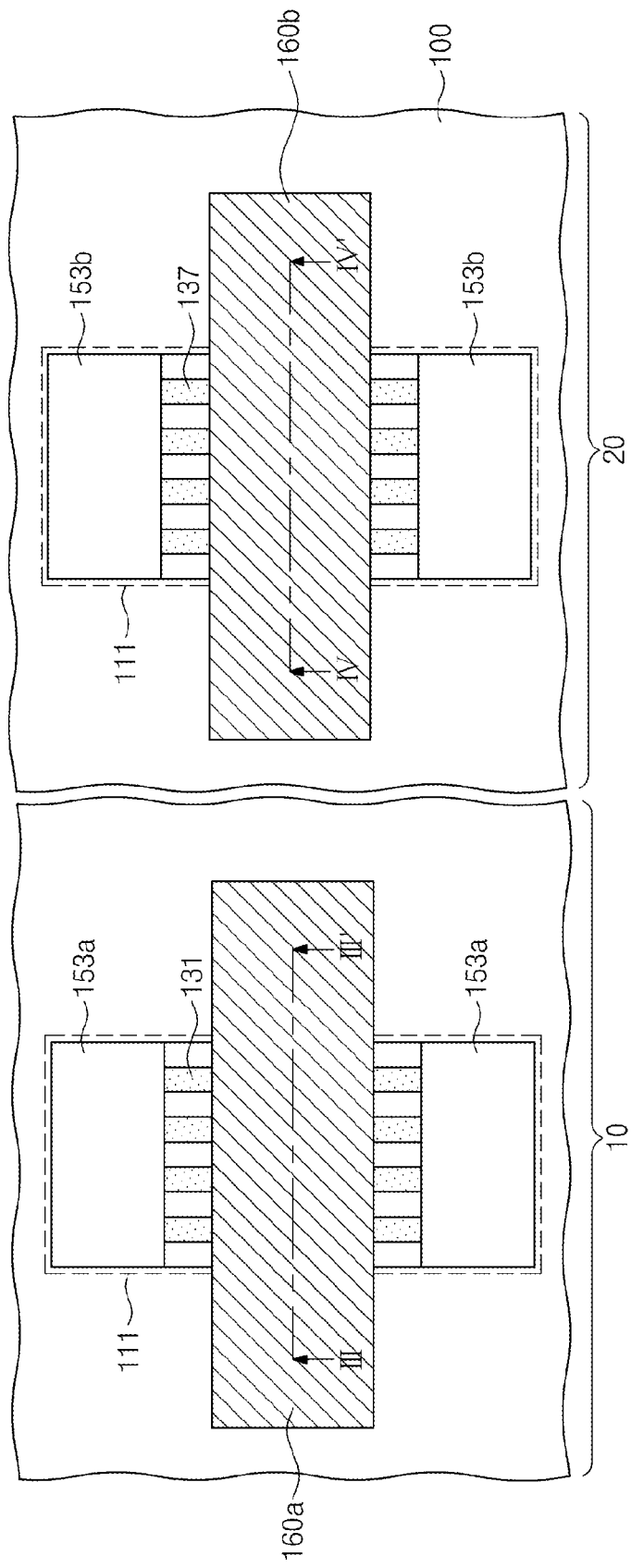
FIG. 7 is a plan view of another embodiment of a semiconductor device according to the inventive concept.

Referring first to FIGS. 7 and 8A, a semiconductor substrate 100 includes a first region 10 and a second region 20, and an NMOS field effect transistor is formed on the first region 10, and a PMOS field effect transistor is formed on the second region 20. An insulating layer 110 is disposed on the first and second regions 10 and 20 of the substrate 100.

First trenches 111 are formed in the insulating layer 110 on the first and second regions 10 and 20, respectively. The first trenches 111 may expose the semiconductor substrate 100, and each of them may have a first width W1 smaller than a thickness H1 of the insulating layer 110. Also, the width of the trench 111 on the first region 10 may be the same as different from the width of the trench 111 on the second region 20. In any case, each of the first trenches 111 preferably have an aspect ratio (depth to width) ranging from about 1 to about 3, both inclusive. In a working example, the width W1 of each first trench 111 ranges from about 50 nm to about 500 nm.

An SEG process may be performed to form buffer layers 120 in the first trenches 111. The buffer layers 120 may be formed of a semiconductor material whose lattice constant is different from that of the semiconductor substrate 100. For example, the buffer layers 120 may be formed of at least one material selected from the group consisting of Si, Ge, SiGe, and Group III-V semiconductor compounds.

The buffer layers 120 may be simultaneously formed on the first and second regions 10 and 20. Alternatively, one of the buffer layers 120 may be formed on the first region 10, and then, the other may be formed on the second region 20. In this case, the buffer layers 120 on the first and second regions 10 and 20 may be different from each other in terms of lattice constant or composition (different ratios of elements in the same material), for example.

On each of the first and second regions 10 and 20, as was described with reference to FIG. 2B, each of the buffer layers 120 has a lower portion 120a with crystal defects and an upper portion 120b which is substantially free of crystal defects. For example, most of the threading dislocations 120d formed during the SEG process may be trapped or localized in a region below a specific height H2 from the top surface of the semiconductor substrate 100. That is, the density of the threading dislocations 120d decreases in a vertical direction away from the semiconductor substrate 100.

Also, each of the buffer layers 120 may be formed to fill a corresponding one of the first trenches 111. Furthermore, the SEG process may be performed in an over-growth manner and in this case, the top surfaces of the buffer layers 120 are disposed above the level of the insulating layer 110. Due to the difference in the rates at which the crystals grow in different crystal planes, the top surface of the buffer layer 120 may have facets, each of which lies in a plane extending at an acute angle relative to the top surface of the semiconductor substrate 100. After the SEG process, the buffer layer 120 may be planarized until its top surface is coplanar with that of the insulating layer 110.

Figure 8B:
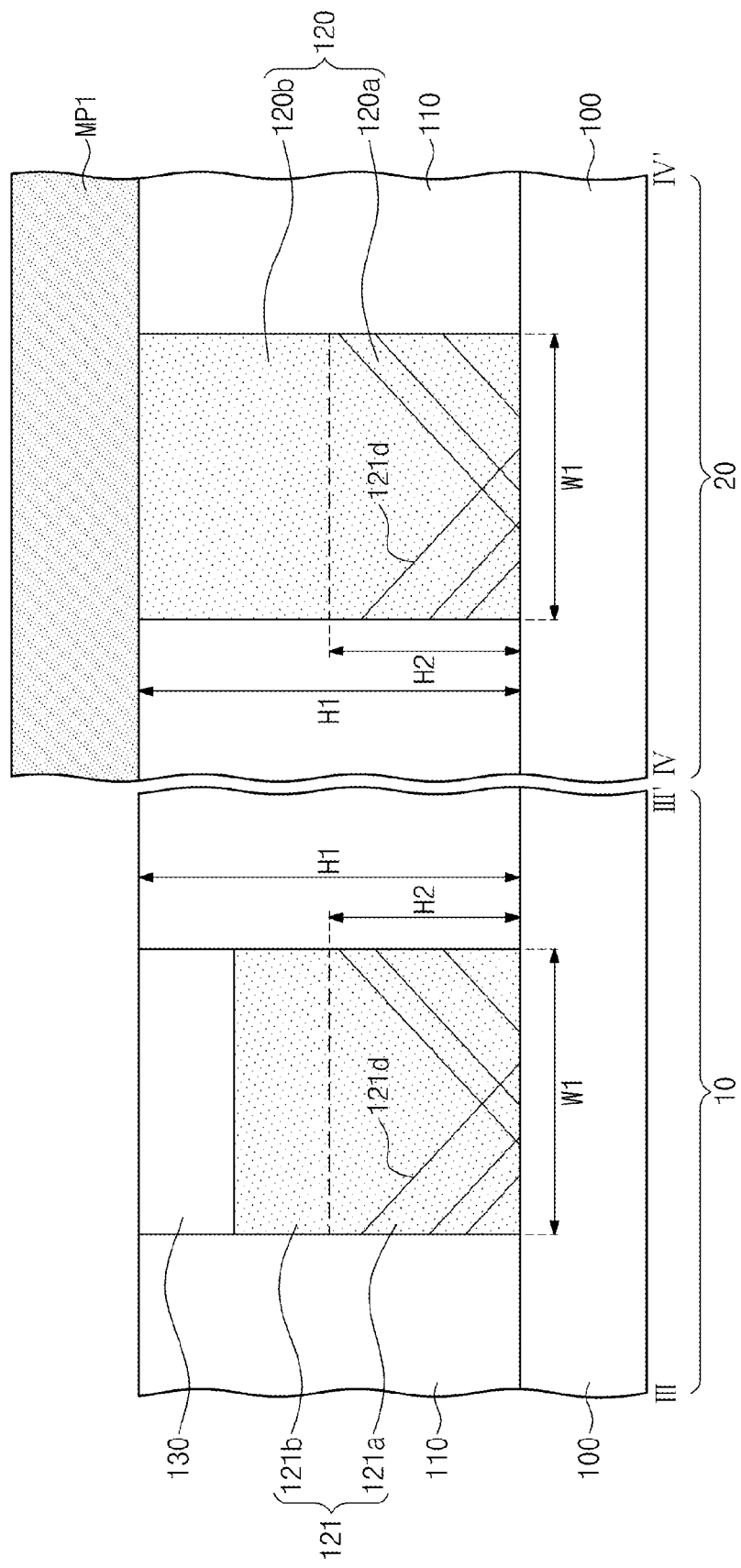

Referring to FIGS. 7 and 8B, a first mask MP1 is formed on the second region 20 to cover one of the buffer layers 120. Subsequently, the buffer layer 120 of the first region 10 exposed by the first mask MP1 is vertically recessed to form a first buffer pattern 121. In the illustrated example, the height of the first buffer pattern 121 is smaller than the thickness H1 of the insulating layer 110 and greater than the thickness, i.e., H2, of the lower portion of the buffer pattern 121. Thus, the first buffer pattern 121 has a lower portion 121a with crystal defects and an upper portion 121b which is substantially free of crystal defects.

Next, a first channel layer 130 is formed on the first buffer pattern 121 to fill the first trench 111 on the first region 10. The first channel layer 130 may be formed of a material whose energy band gap is different from that of the first buffer pattern 121. For example, the first buffer pattern 121 may be formed of $Si_{1-x}Ge_x$, and the first channel layer 130 may be formed of Si. Alternatively, the first buffer pattern 121 may be formed of $Si_{1-x}Ge_x$, and the first channel layer 130 may be formed of $Si_{1-y}Ge_y$ (wherein x>y). In still another example, the first buffer pattern 121 may be formed of $In_{1-x}Ga_xAs$, and the first channel layer 130 may be formed of $In_{1-y}Ga_yAs$ (wherein x<y).

Also, the first channel layer 130 may be formed using an SEG process, and the first mask MP1 may be removed after the formation of the first channel layer 130. Furthermore, the first channel layer 130 may be planarized so that the first channel layer 130 has a flat top surface.

Figure 8C:
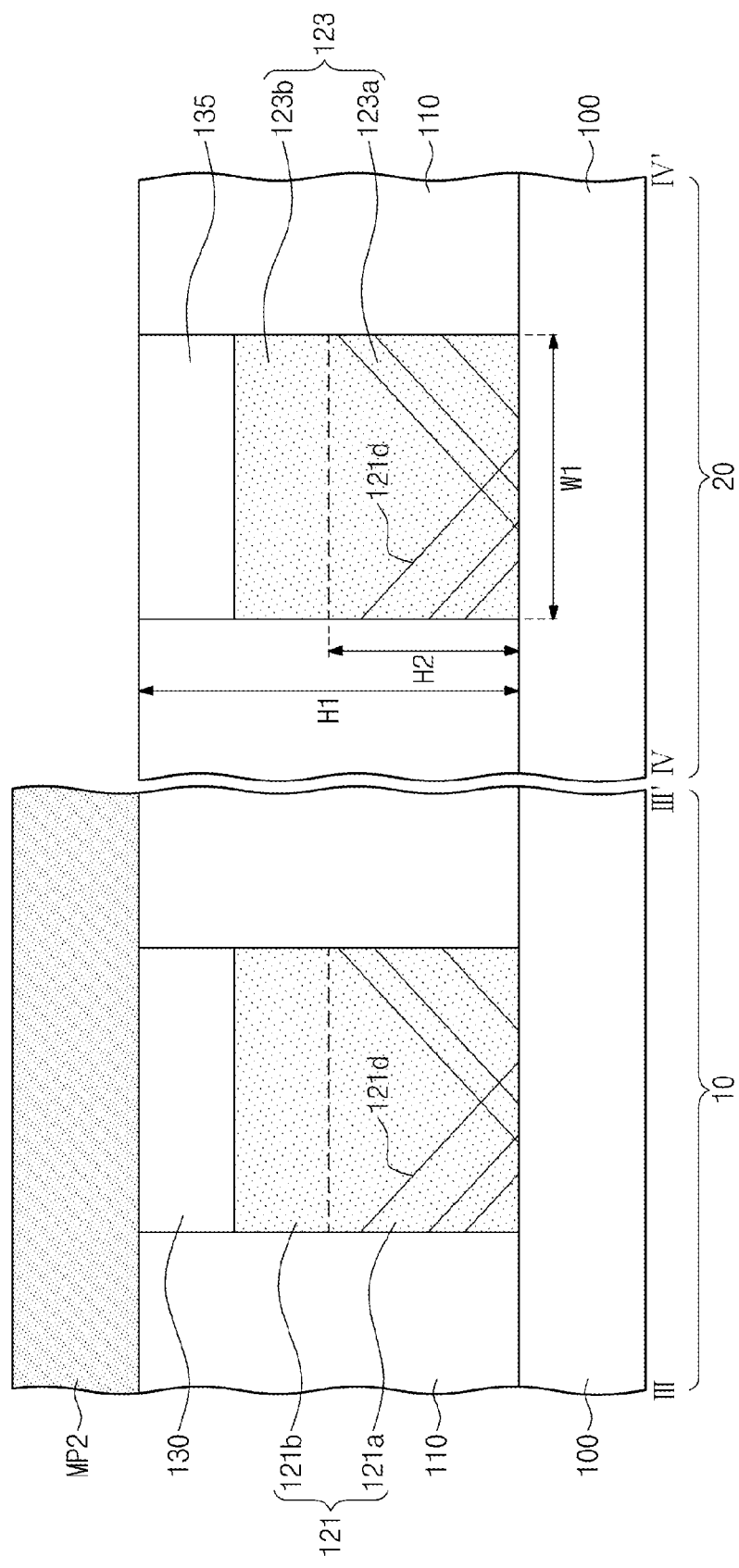

Referring to FIGS. 7 and 8C, a second mask MP2 is formed on the first region 10 to cover the first channel layer 130. Subsequently, the buffer layer 120 of the second region 20 exposed by the second mask MP2 is recessed to form a second buffer pattern 123. In the illustrated example, the height of the second buffer pattern 123 is smaller than the thickness H1 of the insulating layer 110 and greater than the thickness, i.e., H2, of the lower portion of the buffer pattern 121. Thus, the second buffer pattern 123 has a lower portion 123a with crystal defects and an upper portion 123b which is substantially free of crystal defects.

Next, a second channel layer 135 is formed on the second buffer pattern 123 to fill the first trench 111 on the second region 20. The second channel layer 135 may be formed of a material whose energy band gap is different from that of the second buffer pattern 123. Furthermore, the second channel layer 135 may be formed of a material different from the first channel layer 130. For example, the second buffer pattern 123 may be formed of $Si_{1-x}Ge_x$, and the second channel layer 135 may be formed of Ge. Alternatively, the second buffer pattern 123 may be formed of $Si_{1-z}Ge_z$, and the second channel layer 135 may be formed of $Si_{1-w}Ge_w$ (wherein z<w). In still another example, the second buffer pattern 123 may be formed of $In_{1-z}Ga_zAs$, and the second channel layer 135 may be formed of $In_{1-w}Ga_wAs$ (wherein z>w).

Also, the second channel layer 135 may be formed using an SEG process, and the second mask MP2 may be removed after the formation of the second channel layer 135. Furthermore, the second channel layer 135 may be planarized so that the second channel layer 135 has a flat top surface.

Figure 8D:
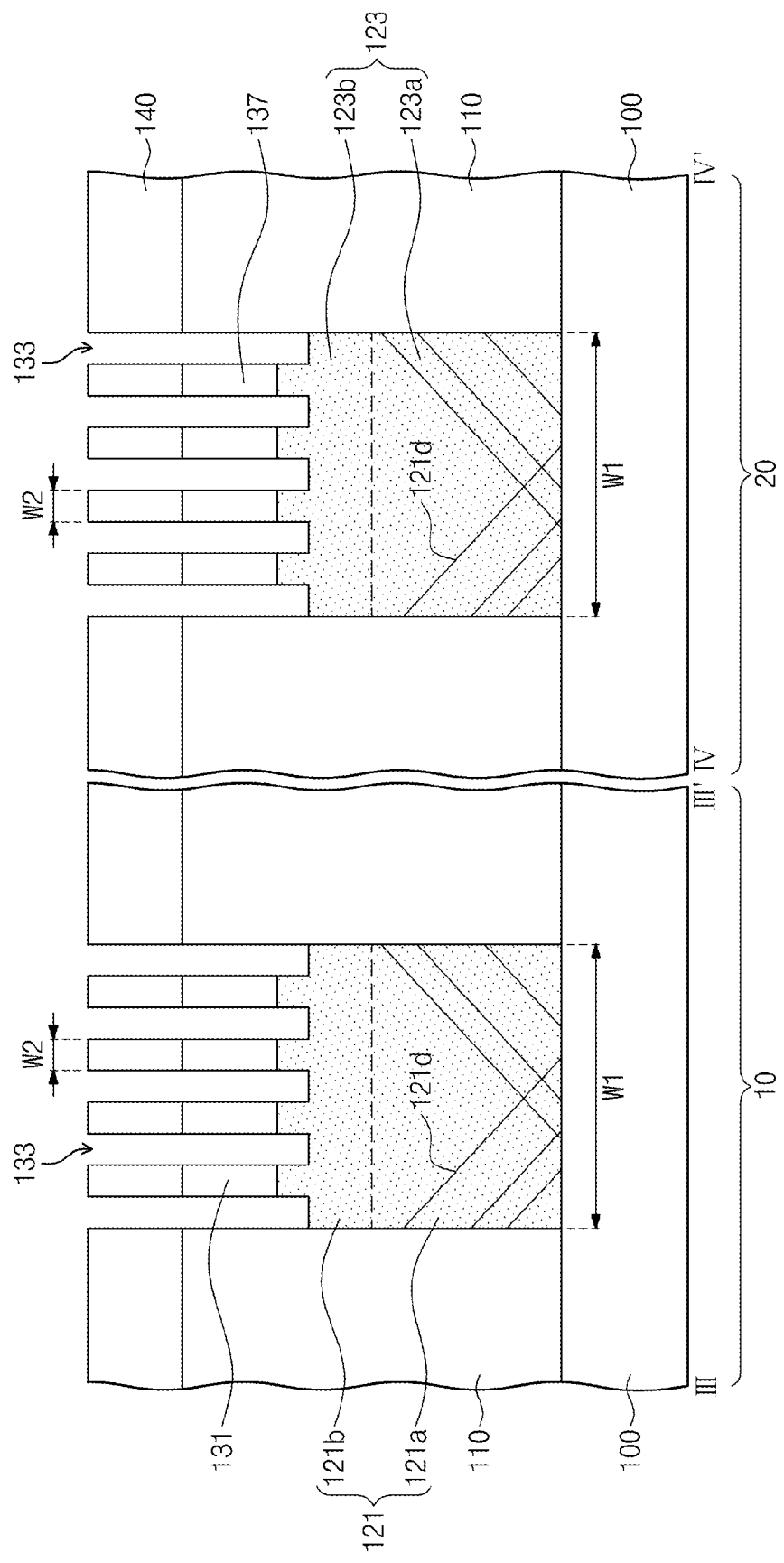

Referring to FIGS. 7 and 8D, the first channel layer 130 and the second channel layer 135 are patterned to form first fin-shaped channel patterns 131 and second fin-shaped channel patterns 137.

For example, the forming of the first fin-shaped channel patterns 131 and the second fin-shaped channel patterns 137 includes forming a mask 140 on the insulating layer 110 to expose portions of the first channel layer 130 and the second channel layer 135, and then, anisotropically etching the first channel layer 130 and the second channel layer 135 using the mask 140 as an etch mask to form second trenches 133. The second trenches 133 may be formed to expose part of the sidewall surface of the insulating layer 110. Also, the first and second buffer patterns 121 and 123 may be partially etched when the second trenches 133 are formed.

As a result, each of the second trenches 133 is narrower than the first trench 111 above which it is located. Therefore, the width W2 of each of the first fin-shaped channel patterns 131 is less than the width W1 of the first trench 111 in which the first fin-shaped channel patterns 131 are formed (corresponding to width of the lower portion 121a of the first buffer pattern 121). Similarly, the width W2 of each of the second fin-shaped channel patterns 137 is less than the width W1 of the first trench 111 in which the second fin-shaped channel patterns 137 are formed (corresponding to width of the lower portion 123a of the second buffer pattern 123).

Figure 8E:
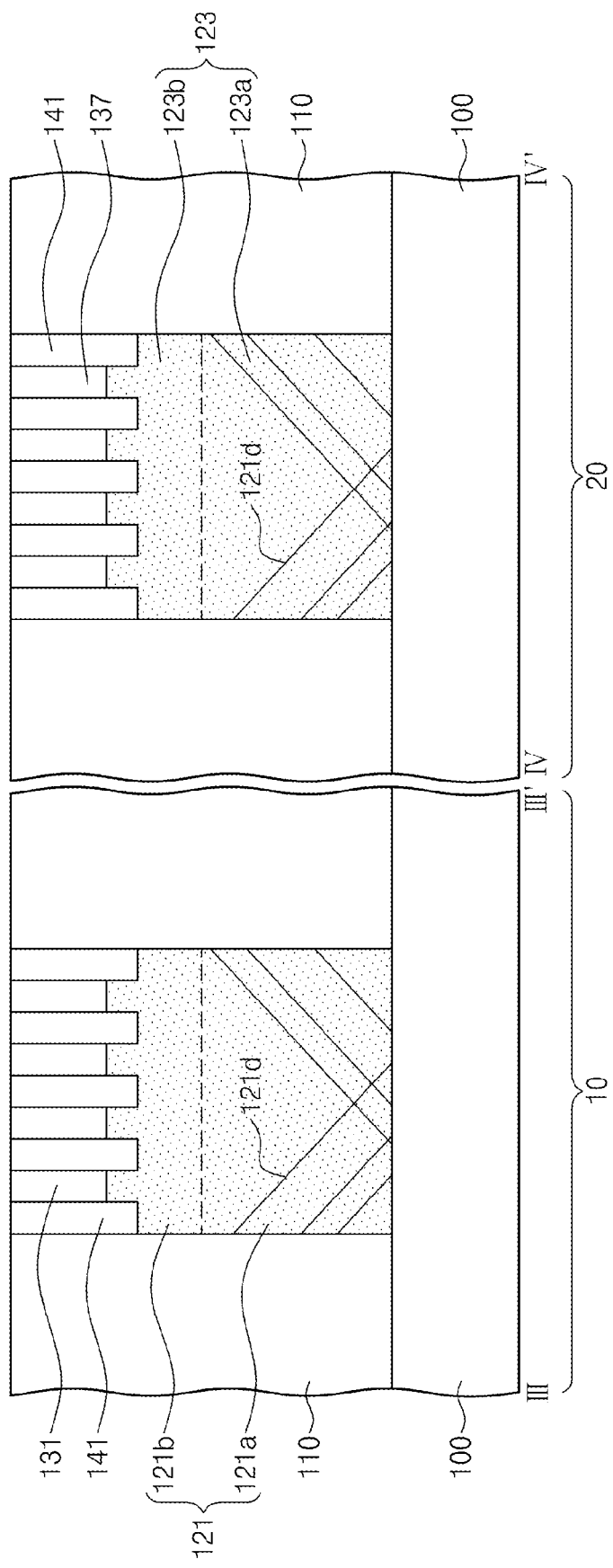

Referring to FIG. 8E, insulating gap-filling layer 141 is formed to fill the second trenches 133. The insulating gap-filling layer 141 may be formed of an insulating material having a good gap-filling property, and the insulating gap-filling layer 141 may be formed of the same insulating material as the insulating layer 110. The insulating gap-filling layer 141 is preferably formed using a deposition process having a good step coverage property. After the deposition process has been performed, the insulating gap-filling layer 141 may be planarized to expose top surfaces of the first fin-shaped channel patterns 131 and the second fin-shaped channel patterns 137.

Figure 8F:
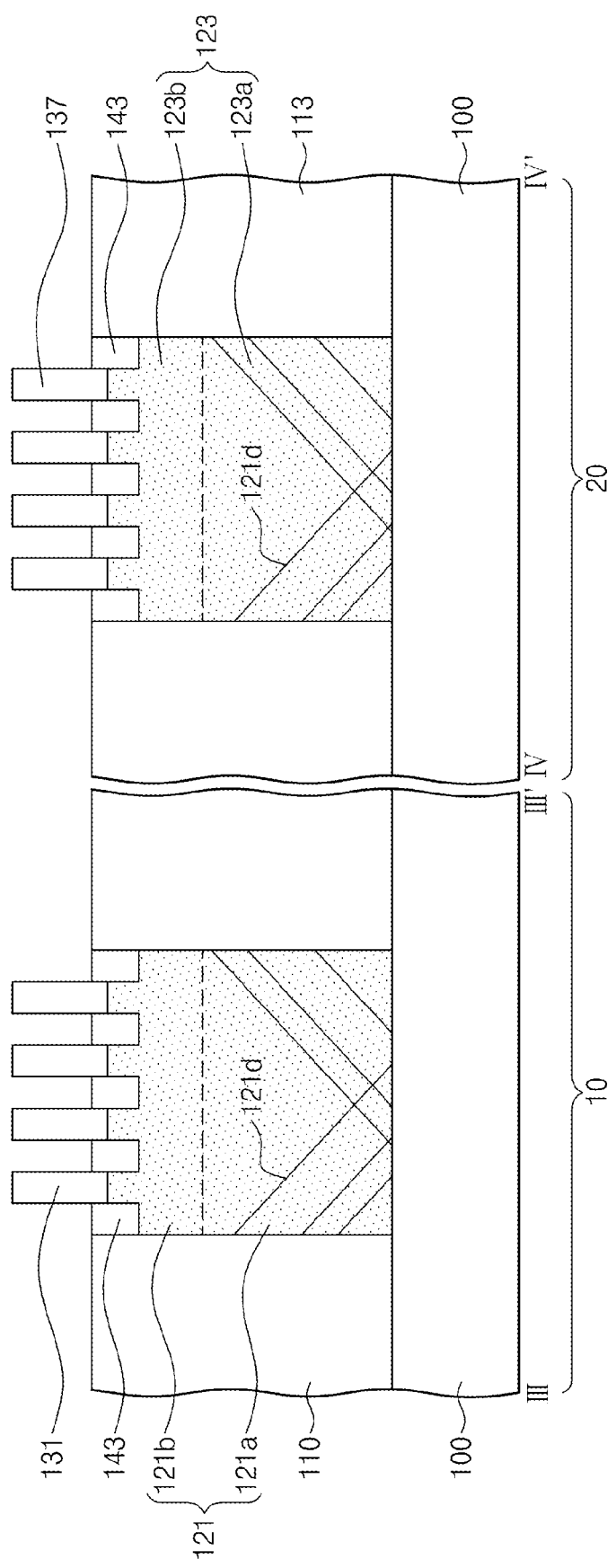

Referring to FIG. 8F, the insulating layer 110 and the insulating gap-filling layer 141 are etched back and thus, sidewall surfaces of the first fin-shaped channel patterns 131 and the second fin-shaped channel patterns 137 are exposed. Accordingly, insulating gap-filling patterns 143 are formed between the first fin-shaped channel patterns 131 and between the second fin-shaped channel patterns 137. Also, the top surfaces of the recessed insulating layer 113 and the insulating gap-filling pattern 143 may be located at a level between those of the top and bottom surfaces of the first fin-shaped channel patterns 131 or the second fin-shaped channel patterns 137.

Figure 8G:
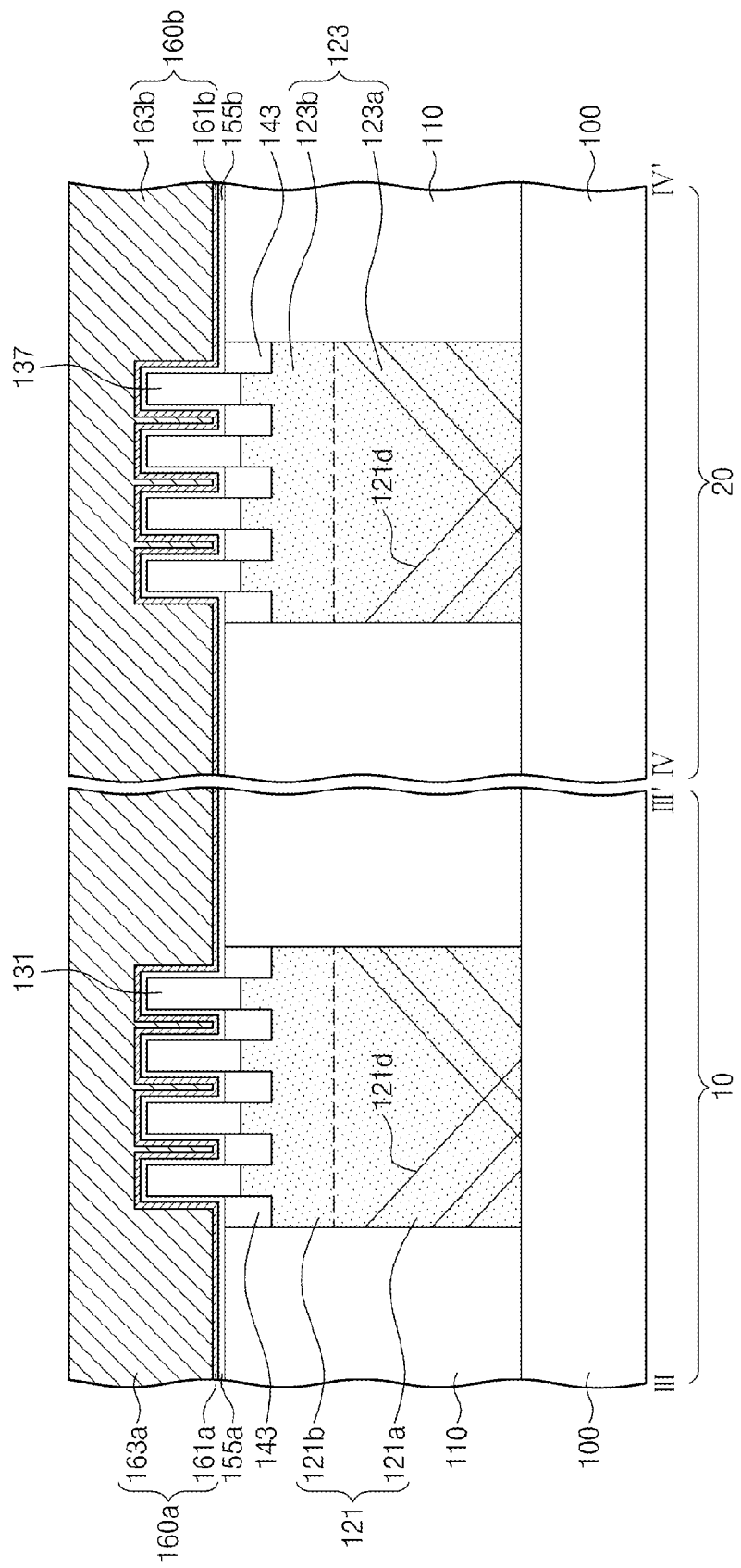

Referring to FIGS. 7 and 8G, first gate insulating layer 155a and first gate electrode 160a are sequentially formed on the first region 10 to cross the first fin-shaped channel patterns 131, and second gate insulating layer 155b and a second gate electrode 160b are sequentially formed on the second region 20 to cross the second fin-shaped channel patterns 137.

The first and second gate insulating layers 155a and 155b may be formed of a high-k dielectric (e.g., hafnium oxide, hafnium silicate, zirconium oxide, or zirconium silicate). The first and second gate electrodes 160a and 160b may also be formed to contain metallic materials whose work-functions are different from each other. The first gate electrode 160a may include a first barrier metal layer 161a and a first metal layer 163a, and the second gate electrode 160b may include a second barrier metal layer 161b and a second metal layer 163b.

The first and second barrier metal layers 161a and 161b may be formed of at least one metal nitride, for example, titanium nitride, tantalum nitride, tungsten nitride, hafnium nitride, or zirconium nitride. The first and second metal layers 163a and 163b may be formed of at least one material selected from the group consisting of tungsten, copper, hafnium, zirconium, titanium, tantalum, aluminum, ruthenium, palladium, platinum, cobalt, nickel, and conductive metal nitrides.

Furthermore, as shown in FIG. 7, first source and drain electrodes 153a may be formed at both sides of the first gate electrode 160a, and second source and drain electrodes 153b may be formed at both sides of the second gate electrode 160b.

Figure 9:
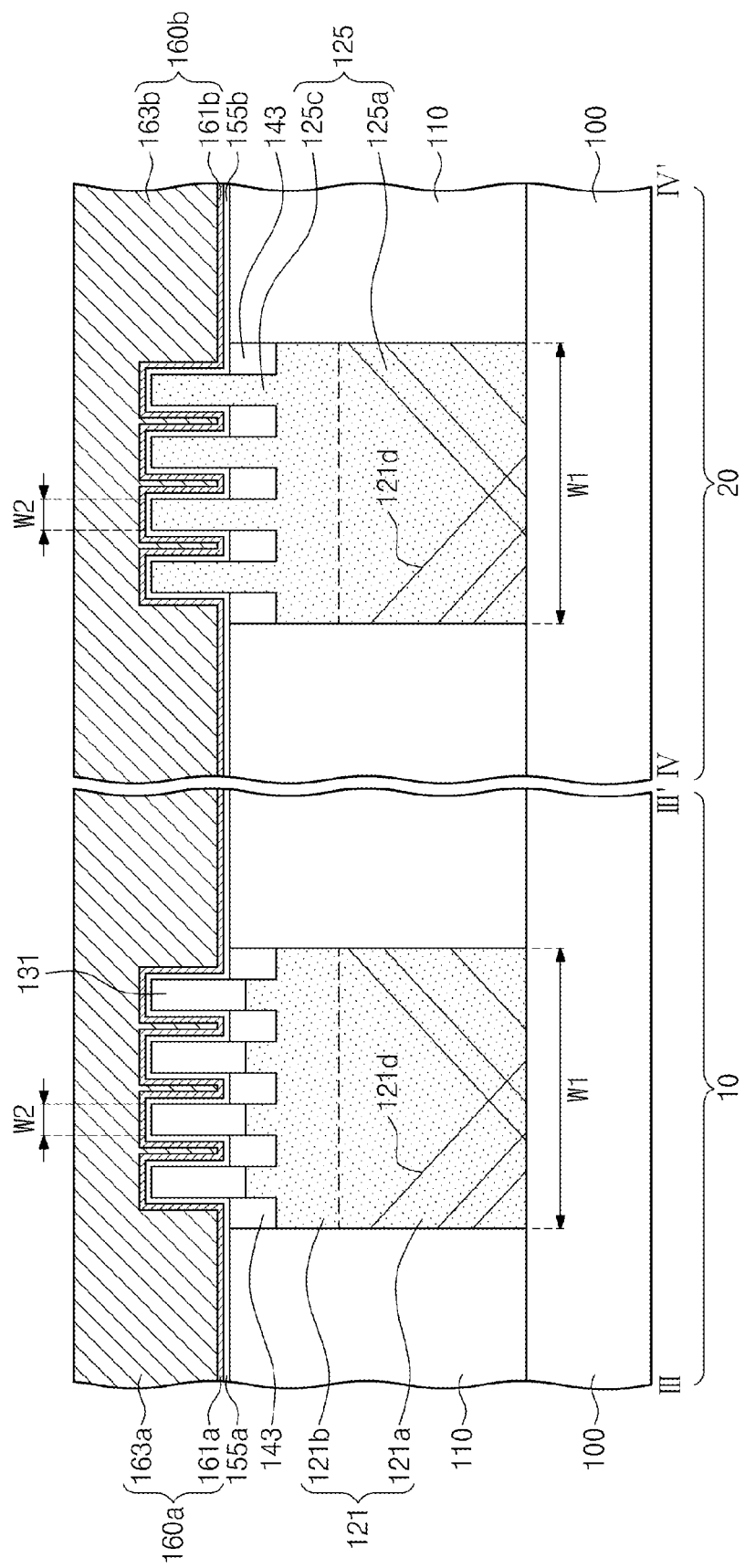
FIG. 9 is a sectional view of another example of a semiconductor device according to the inventive concept.

FIG. 9 is a sectional view of still another example of a semiconductor device according to the inventive concept.

In the embodiment shown in FIG. 9, first buffer pattern 121 and first fin-shaped channel patterns 131 are formed on the first region 10, and second buffer pattern 125 is formed on the second region 20.

The lower portion 125a of the second buffer pattern 125 has the same width W1 as the trench 111 in which it is formed, and the second buffer pattern 125 has a plurality of fin-shaped portions 125c extending from the lower portion 125a. Each of the fin-shaped portions 125c has a width W2 smaller than the width W1. The fin-shaped portions 125c may be formed such that their top surfaces are substantially coplanar with those of the first fin-shaped channel patterns 131.

Furthermore, in this example, the first buffer pattern 121 and the second buffer pattern 125 may be formed of different materials. For example, the first buffer pattern 121 may be formed of a Group III-V compound semiconductor material, while the second buffer pattern 125 is formed of SiGe. Alternatively, the first buffer pattern 121 and the second buffer pattern 125 may be formed of the same materials/compounds, but in which the ratios of the elements that make up the materials/compounds are different from each other.

Figure 10:
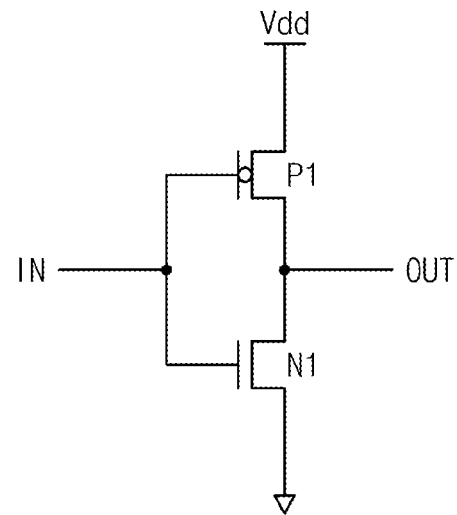
FIG. 10 is a circuit diagram of a CMOS inverter including a CMOS transistor according to the inventive concept.

FIG. 10 illustrates an example of a CMOS inverter including a CMOS transistor according to the inventive concept.

Referring to FIG. 10, the CMOS inverter of this example includes a PMOS transistor P1 and an NMOS transistor N1. The PMOS and NMOS transistors P1 and N1 are connected in series between a driving voltage terminal Vdd and a ground voltage terminal $V_{SS}$, and an input signal IN may be inputted in common to the gates of the PMOS and NMOS transistors P1 and N1. An output signal OUT may be outputted in common from the drains of the PMOS and NMOS transistors P1 and N1. Also, a driving voltage $V_{DD}$ is applied to the source of the PMOS transistor P1, and a ground voltage $V_{SS}$ is applied to the source of the NMOS transistor. The CMOS inverter inverts the input signal IN and outputs the output signal OUT. In other words, when a logic level '1' is inputted as the inverter input signal IN, a logic level '0' may be outputted as the output signal OUT. On the other hand, when a logic level '0' is inputted as the inverter input signal IN, a logic level '1' is outputted as the output signal OUT.

Figure 11:
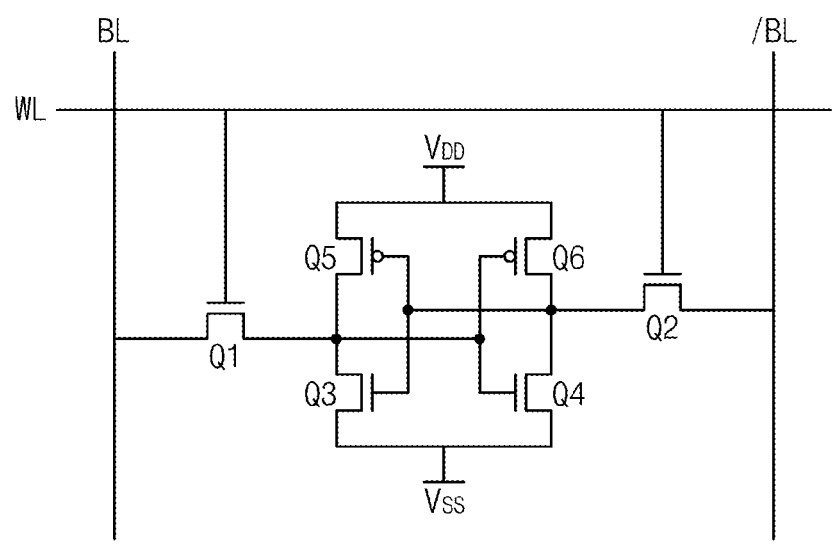
FIG. 11 is a circuit diagram of an SRAM device including a CMOS transistor according to the inventive concept.

FIG. 11 illustrates an example of an SRAM device including a CMOS transistor according to the inventive concept.

Referring to FIG. 11, in this example, each cell in the SRAM device includes first and second access transistors Q1 and Q2, first and second driving transistors Q3 and Q4, and first and second load transistors Q5 and Q6. Also, the sources of the first and second driving (pull-up) transistors Q3 and Q4 are connected to a ground line $V_{SS}$, and the sources of the first and second load transistors Q5 and Q6 are connected to a power line VDD.

The first driving transistor Q3 and the first load transistor Q5, which may be NMOS and PMOS transistors, may constitute a first inverter. Likewise, the second driving transistor Q4 and the second load transistor Q6, which may be NMOS and PMOS transistors, may constitute a second inverter.

The output terminals of the first and second inverters are connected to the sources of the first and second access transistors Q1 and Q2. Also, the input terminal of the first inverter and the output terminal of the second inverter are connected and conversely the input terminal of the second inverter and the output terminal of the first inverter are connected, to constitute a latch circuit. The drains of the first and second access transistors Q1 and Q2 may be connected to first and second bit lines BL and /BL, respectively.

Figure 12:
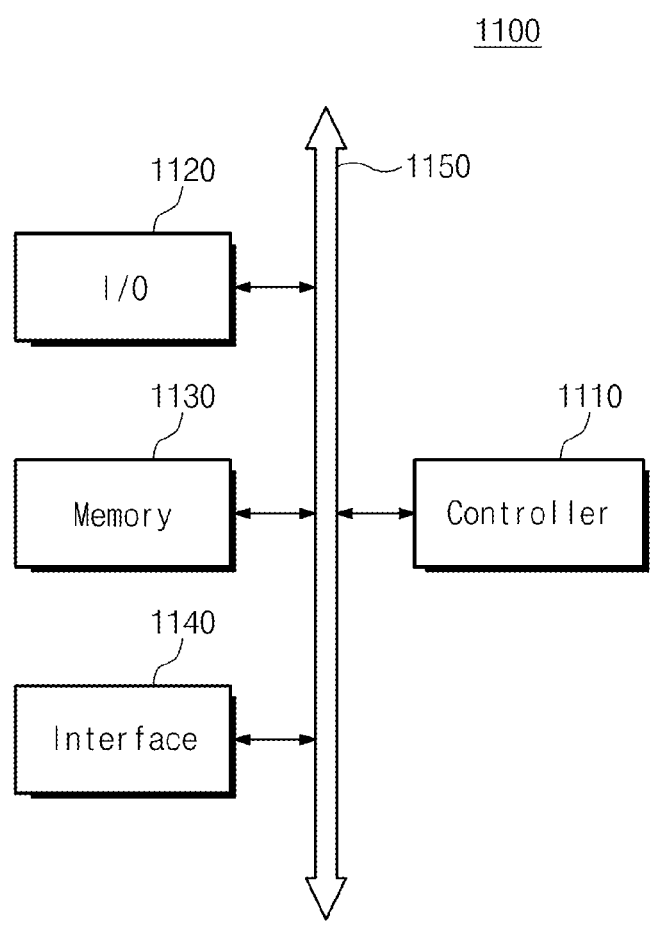
FIG. 12 is a schematic block diagram of an example of an electronic system including a semiconductor device according to the inventive concept.

FIG. 12 illustrates an example of an electronic system including a semiconductor device according to the inventive concept.

The electronic system may be that of an electronic product such a personal digital assistant (PDA), a portable computer, a web tablet, a wireless phone, a mobile phone, a digital music player, a memory card, or the like. Such electronic products may receive or transmit information or data by wireless.

Referring to FIG. 12, the electronic system 1100 of this example includes a controller 1110, an input-output (I/O) unit 1120, a memory device 1130, an interface 1140, and a bus 1150 serving as a pathway for data communication. The controller 1110, the input-output unit 1120, the memory device 1130 and/or the interface 1140 may be connected or coupled to each other via the bus 1150. At least one of the controller 1110, the input-output unit 1120, the memory device 1130, and/or the interface 1140 includes a semiconductor device according to the inventive concept.

The controller 1110 may include at least one of a microprocessor, a digital signal processor, a microcontroller, or similar logic device. The input-output unit 1120 may include a keypad, keyboard, a display device, or the like.

The memory device 1130 may be configured to store data and/or commands. The interface unit 1140 may transmit electrical data to a communications network or may receive electrical data from a communications network.

The interface unit 1140 may operate by wireless or cable. For example, the interface unit 1140 may include an antenna for wireless communications or a transceiver for cable communications. Although not shown in the drawings, the electronic system 1100 may further include a fast DRAM device and/or a fast SRAM device, which may serve as a cache memory for improving an operation of the controller 1110.

According to the inventive concept as described above, a semiconductor pattern is formed in a trench dimensioned such that crystal defects are trapped or localized in a lower portion of the semiconductor pattern. Accordingly, an upper portion of the semiconductor pattern is formed without crystal defects. The upper portion of the semiconductor pattern is patterned to form a plurality of fins, each of which is narrower than the lower portion of the semiconductor pattern. This makes it possible to realize fin field effect transistor with high density and improved characteristics.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A semiconductor device comprising:
a substrate;
an insulating layer disposed on the substrate and having a trench exposing a surface portion of the substrate;
a channel-forming structure comprising crystalline semiconductor material, the channel-forming structure having a lower portion located in the trench and fins extending upright on the lower portion, wherein the fins are spaced from each other and are each narrower than an opening of the trench, and the lower portion of the channel-forming structure has a higher crystal defect density than the fins of the channel-forming structure.

2. The semiconductor device of claim 1, wherein the fins are devoid of crystal defects.

3. The semiconductor device of claim 1, wherein the fins extend along a length of the trench, are spaced from each other in a widthwise direction of the trench, and are each narrower than the trench in the widthwise direction.

4. The semiconductor device of claim 1, wherein the fins extend upward beyond the opening of the trench.

5. The semiconductor device of claim 1, wherein the crystal defect density in the lower portion of the channel-forming structure increases in a depth direction of the trench.

6. The semiconductor device of claim 1, wherein the fins include respective buffer patterns which are a unitary part of the lower portion of the channel-forming structure, and fin-shaped channel patterns on the respective buffer patterns, the buffer patterns and the fin-shaped channel patterns having different energy band gaps.

7. The semiconductor device of claim 6, wherein the fin-shaped channel patterns comprise a material selected from the group consisting of Ge, SiGe, and a Group III-V semiconductor compound.

8. The semiconductor device of claim 6, wherein the buffer patterns and the fin-shaped channel patterns are formed of Group III-V semiconductor compounds having respectively different energy band gaps.

9. The semiconductor device of claim 1, wherein the channel-forming structure is a unitary body of semiconductor material.

10. The semiconductor device of claim 9, wherein the semiconductor material is selected from the group consisting of Ge, SiGe, and a Group III-V semiconductor compound.

11. The semiconductor device of claim 3, wherein a depth-to-width aspect ratio of the trench is between 1:1 and 3:1 both inclusive.

12. The semiconductor device of claim 11, wherein the width of the trench is at least 50 nm.

13. The semiconductor device of claim 3, further comprising a gate electrode extending longitudinally across the fins in the widthwise direction of the trench, a gate insulating layer interposed between the gate electrode and the fins, and source/drain regions in the trench at opposite ends of the fins.

14. A semiconductor device comprising:
a semiconductor substrate;
an insulating layer disposed on the substrate and having a trench exposing a surface portion of the substrate, wherein a depth-to-width aspect ratio of the trench is between 1:1 and 3:1 both inclusive; and
a crystalline channel-forming structure disposed in the trench, the crystalline channel-forming structure having an epitaxial lower portion disposed on the surface portion of the semiconductor substrate and occupying a bottom portion of the trench, and epitaxial fins extending upright on the lower portion,
wherein the epitaxial fins are spaced from each other in a widthwise direction of the trench and are each narrower than the trench in the widthwise direction.

15. The semiconductor device of claim 14, wherein the width of the trench is at least 50 nm.

16. The semiconductor device of claim 15, wherein the epitaxial fins include respective buffer patterns which are a unitary part of the epitaxial lower portion of the crystalline channel-forming structure, and fin-shaped epitaxial channel patterns on the respective buffer patterns, the buffer patterns and the fin-shaped channel patterns having different energy band gaps.

17. The semiconductor device of claim 16, wherein the buffer pattern and the fin-shaped channel patterns are formed of Group III-V semiconductor compounds having respectively different energy band gaps.

18. The semiconductor device of claim 14, further comprising a gate electrode extending longitudinally across the epitaxial fins in the widthwise direction of the trench, a gate insulating layer interposed between the gate electrode and the epitaxial fins, and source/drain regions in the trench at opposite ends of the epitaxial fins.

19. A semiconductor device comprising:
a substrate;
an insulating layer disposed on the substrate and having a first trench exposing a first surface portion of the substrate and a second trench exposing a second surface portion of the substrate;
a first channel-forming structure comprising crystalline semiconductor material, the first channel-forming structure having a first lower portion located in the first trench and first fins extending upright on the first lower portion, wherein the first fins are of a first conductivity type, are spaced from each other and are each narrower than an opening of the first trench, and wherein the first lower portion of the first channel-forming structure has a higher crystal defect density than the first fins of the first channel-forming structure; and
a second channel-forming structure comprising crystalline semiconductor material, the second channel-forming structure having a second lower portion located in the second trench and second fins extending upright on the second lower portion, wherein the second fins are of a second conductivity type, are spaced from each other and are each narrower than an opening of the second trench, and wherein the second lower portion of the second channel-forming structure has a higher crystal defect density than the second fins of the second channel-forming structure.

20. The semiconductor device of claim 19, further comprising:
a first gate electrode extending longitudinally across the first fins in a widthwise direction of the first trench, a first gate insulating layer interposed between the first gate electrode and the first fins, and first source/drain regions in the first trench at opposite ends of the first fins, wherein the first fins, the first gate electrode, the first gate insulating layer, and the first source/drain regions constitute a PMOS transistor; and
a second gate electrode extending longitudinally across the second fins in a widthwise direction of the second trench, a second gate insulating layer interposed between the second gate electrode and the second fins, and second source/drain regions in the second trench at opposite ends of the second fins, wherein the second fins, the second gate electrode, the second gate insulating layer, and the second source/drain regions constitute a NMOS transistor;
wherein the PMOS transistor and the NMOS transistor are connected in a CMOS configuration.

* * * * *